United States Patent [19]

Hagemeyer

[11] Patent Number: 4,875,181

[45] Date of Patent: Oct. 17, 1989

[54] METHOD OF APPARATUS FOR REALIZING A LOGICAL OPERATION BY MODIFYING A FLOW OF ENERGY

[75] Inventor: Friedrich-Wilhelm Hagemeyer, Munich, Fed. Rep. of Germany

[73] Assignee: Siemens Aktiengesellschaft, Berlin and Munich, Fed. Rep. of Germany

[21] Appl. No.: 60,936

[22] Filed: Jun. 9, 1987

Related U.S. Application Data

[63] Continuation of Ser. No. 767,072, Aug. 19, 1985, abandoned, which is a continuation of Ser. No. 393,050, Jun. 28, 1982, abandoned.

[30] Foreign Application Priority Data

Aug. 18, 1981 [DE] Fed. Rep. of Germany ....... 3132623

[51] Int. Cl.$^4$ .............................................. G06F 7/56
[52] U.S. Cl. .................................... 364/716; 364/713
[58] Field of Search ................ 364/716, 713; 350/376, 350/392; 307/465

[56] References Cited

U.S. PATENT DOCUMENTS

| | | | |
|---|---|---|---|
| 3,466,433 | 9/1969 | Duda et al. | 364/713 |
| 3,680,080 | 7/1972 | Maure | 364/713 |
| 3,756,690 | 9/1973 | Borrelli et al. | 350/376 |
| 3,944,329 | 3/1976 | Lee, Jr. et al. | 350/376 |
| 3,996,455 | 12/1976 | Schaefer et al. | 364/713 |
| 4,042,814 | 8/1977 | Taylor | 364/713 |
| 4,418,394 | 11/1983 | Tai | 364/713 |

OTHER PUBLICATIONS

Chambers et al., "High-Frequency Faraday Modulator" *IBM Tech. Disclosure Bulletin*, vol. 16, No. 10, p. 3384, Mar. 1974.
Wolfgarten, *Binary Circuits*, Hüthig-Verlag, Heidelberg 1972, pp. 15-22.
Wolfgarten W., Binäre Schaltkreise, Alfres Hüthig Verlzg GmbH, Heidelberg, 1972, pp. 15-22.

*Primary Examiner*—David H. Malzahn
*Attorney, Agent, or Firm*—Hill, Van Santen, Steadman & Simpson

[57] ABSTRACT

A device for realizing logical operations operates extremely fast and exhibits the particular advantage that it can be converted from one logical operation to another so that a plurality of logical operations can be realized with a single component. The device comprises an operation channel which includes a light path for linearly-polarized light, an analyzer which comprises a polarization filter and an operation control which influences the plane of polarization of the polarized light and can controllably alter its rotary position. The rotary position of the plane of polarization of the light is binarily evaluated by the analyzer. The operation control is controlled by logical variables and the logical operation can be modified by one or more separate inputs. Such an embodiment exploits the Faraday effect. A similar device in another embodiment exploits the Pockels effect in which the phase of the light is changed and evaluated with respect to a reference phase.

13 Claims, 11 Drawing Sheets

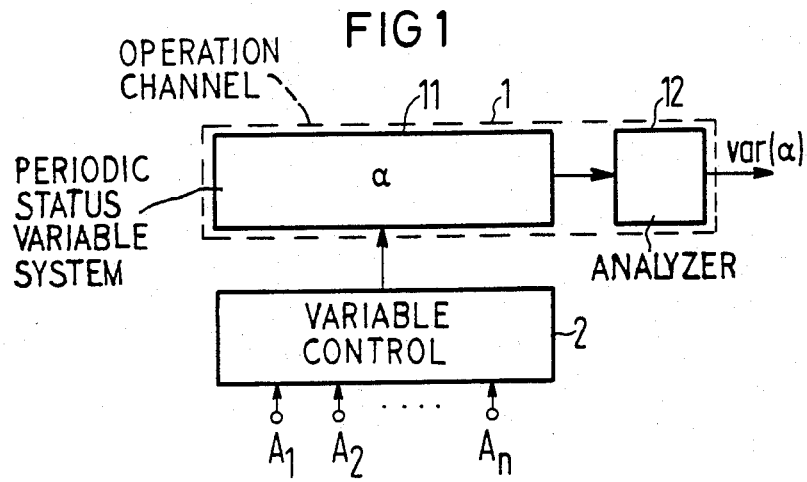
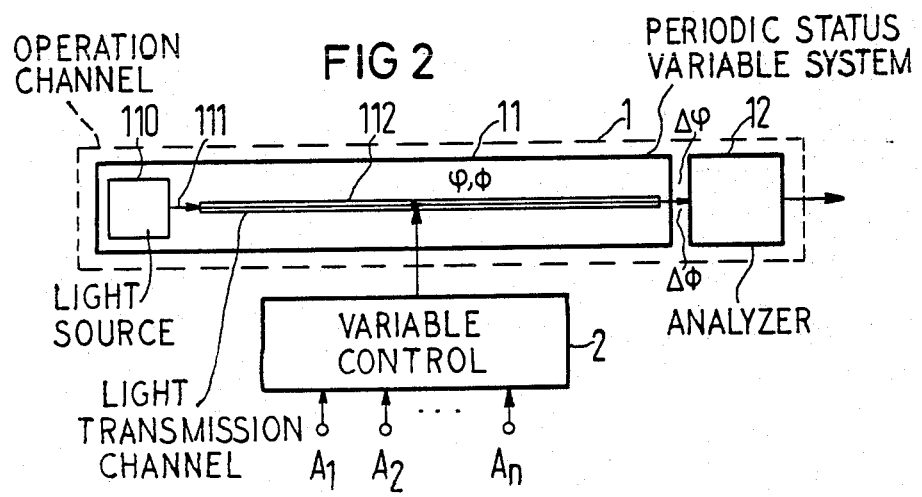

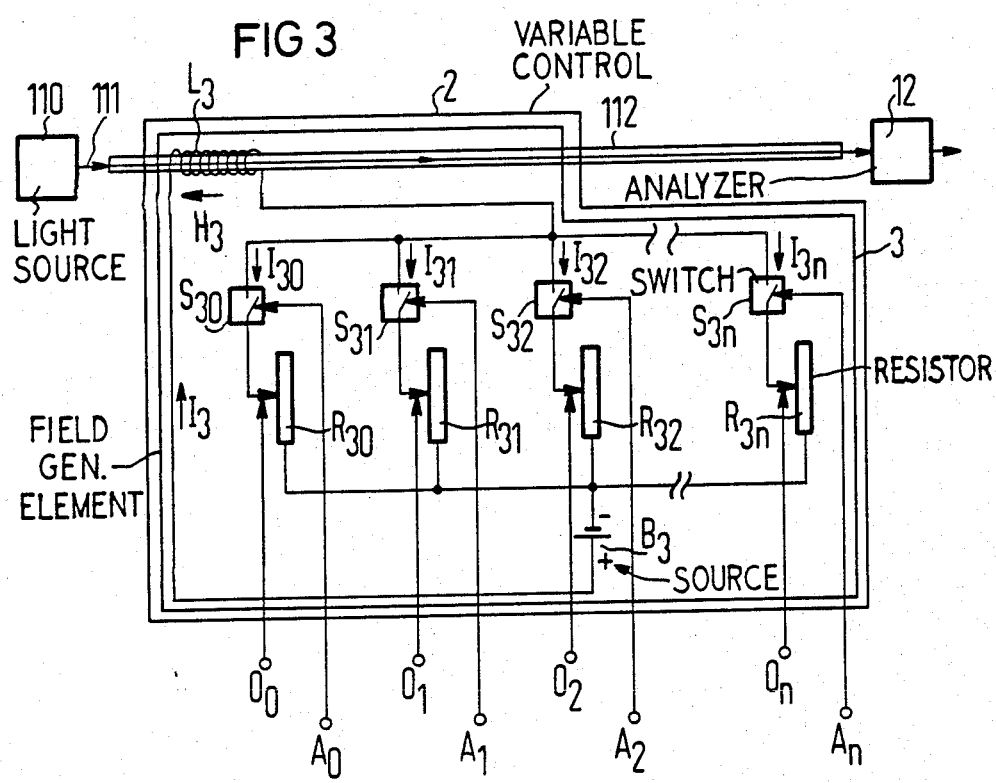
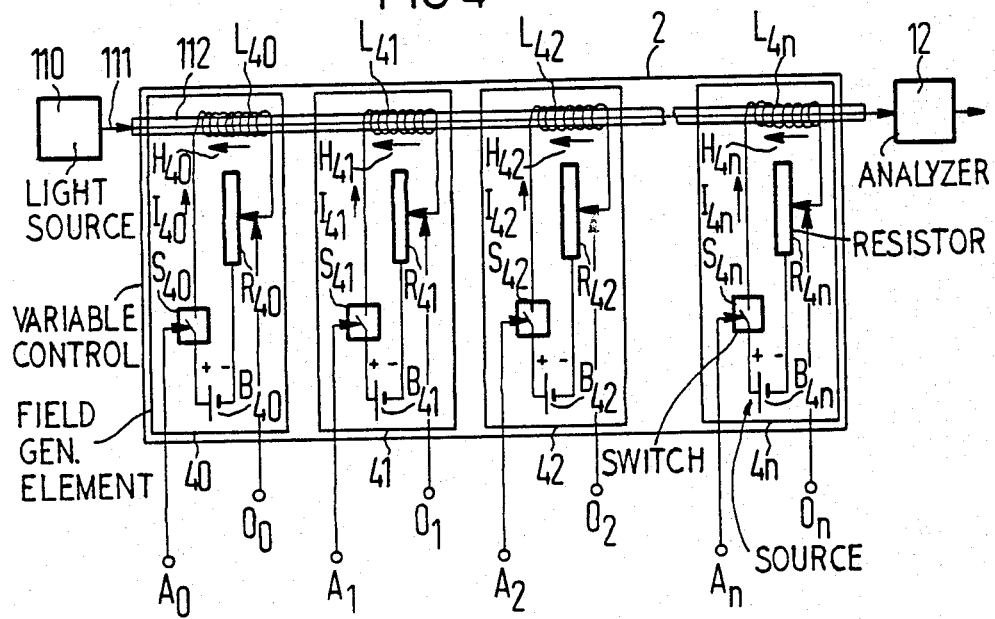

FIG 18

| | PRECEDING CODED SIGNALS | | PULSES GENERATED |
|---|---|---|---|
| 1ST CLOCK | $t_0 - \Delta t_1$ | $t_0 - \Delta t_2$ | $t_0$ |
| | $A_0 = 0$ | $A_0 = b_0$ | |
| | $O_0 = a_0$ | $O_0 = a_0$ | |
| | $A_1 = 0$ | $A_1 = 0$ | |
| | $O_1 = 0$ | $O_1 = 0$ | 1.EP |
| | $A_2 = 0$ | $A_2 = 0$ | |
| | $O_2 = 0$ | $O_2 = 0$ | |
| 2ND CLOCK | $t_0 + T - \Delta t_1$ | $t_0 + T - \Delta t_2$ | $t_0 + T$ |
| | $A_0 = 0$ | $A_0 = b_0'$ | |
| | $O_0 = a_0'$ | $O_0 = a_0'$ | |
| | $A_1 = 0$ | $A_1 = b_1$ | |
| | $O_1 = a_1$ | $O_1 = a_1$ | 2.EP |
| | $A_2 = 0$ | $A_2 = 0$ | |
| | $O_2 = 0$ | $O_2 = 0$ | |
| 3RD CLOCK | $t_0 + 2T - \Delta t_1$ | $t_0 + 2T - \Delta t_2$ | $t_0 + 2T$ |
| | $A_0 = 0$ | $A_0 = b_0''$ | |
| | $O_0 = a_0''$ | $O_0 = a_0''$ | |
| | $A_1 = 0$ | $A_1 = b$ | |
| | $O_1 = a$ | $O_1 = a$ | |
| | $A_2 = 0$ | $A_2 = b$ | |
| | $O_2 = a_2$ | $O_2 = a_2$ | |
| 4TH CLOCK | $t_0 + 3T - \Delta t_1$ | $t_0 + 3T - \Delta t_2$ | $t_0 + 3T$ |
| | $A_0 = 0$ | $A_0 = 0$ | |
| | $O_0 = 0$ | $O_0 = 0$ | |
| | $A_1 = 0$ | $A_1 = b_1''$ | |
| | $O_1 = a_1''$ | $O_1 = a_1''$ | |
| | $A_2 = 0_1'$ | $A_2 = b_2'$ | |
| | $O_2 = a_2$ | $O_2 = a_2'$ | |
| 5TH CLOCK | $t_0 + 4T - \Delta t_1$ | $t_0 + 4T - \Delta t_2$ | $t_0 + 4 + T$ |
| | $A_0 = 0$ | $A_0 = 0$ | |
| | $O_0 = 0$ | $O_0 = 0$ | |
| | $A_1 = 0$ | $A_1 = 0$ | |
| | $O_1 = 0$ | $O_1 = 0$ | |
| | $A_2 = 0$ | $A_2 = b_2''$ | |
| | $O_2 = a_2''$ | $O_2 = a_2''$ | |
| 6TH CLOCK | $t_0 + 5T - \Delta t_1$ | $t_0 + 6T - \Delta t_2$ | $t_0 + 5T$ |
| | $A_0 = 0$ | $A_0 = 0$ | |
| | $O_0 = 0$ | $O_0 = 0$ | |
| | $A_1 = 0$ | $A_1 = 0$ | |
| | $O_1 = 0$ | $O_1 = 0$ | |
| | $A_2 = 0$ | $A_2 = 0$ | |
| | $O_2 = 0$ | $O_2 = 0$ | |

7TH CLOCK LIKE 6TH CLOCK
0 DENOTES NO SIGNAL

METHOD OF APPARATUS FOR REALIZING A LOGICAL OPERATION BY MODIFYING A FLOW OF ENERGY

This is a continuation of application Ser. No. 767,072 filed Aug. 19, 1985, now abandoned, which is a continuation of application Ser. No. 393,050 filed June 28, 1982, now abandoned.

BACKGROUND OF THE INVENTION

1. Field of the Invention

The present invention relates to a device for realizing a logical operation, and is more particularly concerned with a device for carrying out a logical operation with one or more logical variables ($A_1, A_2 \ldots A_n$) given which the logical variables can be input in the form of control signals.

2. Description of the Prior Art

Binary circuits with which logical operations of the bivalent propositional logic are realized are devices, for example, of the type initially cited (v. in that regard, for example, the book "Binäre Schaltkreise, Aufbau - Methoden - Anwendungen" by Walter Wolfgarten, Dr. Alfred Hüthig-Verlag, Heidelberg, 1972). A logical variable which can only assume the two truth values "true" or "false" in the bivalent Boolean logic system is represented in these circuits by a logical variable which can assume switching states, for example, the "on" or "off" position of an on/off switch, corresponding to the two truth values. A logical operation to be carried out with one or more logical variables, the logical operation clearly assigning a truth value of a dependent logical variable to each truth value of the logical variables or, respectively, to each possible set of truth values of the plurality of logical variables and which may therefore be characterized by and is likewise characterized by a so-called truth table in which every possible value or set of values of the independent logic variables and the assigned value of the dependent variables are entered, is determined by a corresponding logic function dependent on corresponding logic variables which can be characterized by a switch state table corresponding to the truth table.

In the electronic binary circuits most frequently employed today, the switch states are given by, for example, two voltage values from two separate voltage ranges H and L which, for example, correspond to the values "true" and "false", respectively, of a logical variable. Therefore, given these electric binary circuits, a logical variable is represented by a binary electrical signal representing the corresponding logical variable. Each signal representing an independent logical variable can be input into the circuit over a, preferably, separate input and the signal representing the dependent logical variable is available at the output of the circuit.

Particularly familiar examples of such binary circuits are, among other things, the negator, the AND element, the OR element, the NAND element and the NOR element. The negator is an example of a binary circuit in which the logical operation can be carried out with only one independent logical variable. Every logical operation realized by the other cited elements is to be executed with at least two independent logic variables which can generally be input as signals over parallel inputs.

A primary desire, given devices of the type initially mentioned, is in further shortening the operation time, i.e. the time duration in which the logical operation s to be carried out. Given binary circuits, the operation time is predominantly determined by the switching time, i.e. by the time interval which is required for a transition from one switch state into the other switch state. Given the fastest binary circuits known today, which are realized by means of certain electronic binary circuits, switching times are achieved which lie in the nanosecond range and which can no longer be significantly improved for technological reasons. Moreover, these switching times appear additively in the realization of complicated logical operations, so that the operation times can lie far above the switching times given such circuits.

SUMMARY OF THE INVENTION

The object of the present invention is to provide a device of the type initially mentioned which makes considerably shorter operation times possible than can be achieved given the fastest devices available today, particularly given complicated logical operations.

According to the present invention, the above object is achieved in a device which is carry out logical operations with one or more variables ($A_1, A_2 \ldots A_n$) given which the variables can be input in the form of control signals, by the provision of an operation channel having a system which is characterized by a periodic status variable ($\alpha, \rho, \emptyset, z$) and which an analyzer with which the values of the periodic status variables can be detected and which assigns logical values (var ($\alpha$), var ($\rho$), var ($\emptyset$), var ($z$)) to these values according to a predetermined evaluation function (var), and by providing a status variable control which is controlled by the logical variables ($A_1, A_2 \ldots A_n$) and influences a system 11 which effects an overall change ($\Delta\alpha, \Delta\rho, \Delta\emptyset, \Delta z$) of the status variables per value or set of values of the logical variables in such a manner that the logical value assigned to the determined value of the status variable accordingly corresponds to that which is assigned in the truth table characterizing the logical operation to the value or set of values of the logical variables.

The essence of the above object therefore lies in the employment of a operation channel with an apparatus characterized by a periodic status variable. What is thereby meant by such a system is every physical system which can be characterized by a cyclical status variable. In order to obtain the shortest possible operation times, one advantageously proceeds in such a manner that all conceivable and realizable apparatus are investigated in light of how fast a characterizing status variable can change. As an example of an apparatus which is fast, in this sense, is linearly-polarized light whose plane of polarization can be distorted by way of electric or magnetic fields. The periodic status variable is thereby given by the rotational angle of the plane of polarization. The rotation of the plane of polarization can be carried out with practically random speed, so that such an operation channel requires practically no operation time for the change of the status variable. Accordingly, the operation time of the exemplary device is predominantly determined by the status variable control and by the analyzer. These, however, as shall be shown hereinbelow, can be designed in such a manner that they require an extremely short operation time, even given many independent variables, i.e. more complicated operations, particularly because, as shall likewise be shown hereinbelow, the work can be carried out in parallel.

Let it be expressly pointed out that the new principle set forth herein can also be applied when it is not a matter of particularly short operation times. Moreover, let it again be emphasized that every physical system which is characterized by or can be characterized by a periodic status variable comes into consideration as the apparatus, so that the path to a multitude of realization feasibilities for devices of the type initially mentioned has been opened up by the present invention.

A particularly advantageous embodiment of a device constructed in accordance with the present invention is characterized in that the status variable control is designed as a variable operation control in which the overall change of the status variable assigned to the individual values or sets of values of the logical variables are individually variable.

The significant advantage of this device lies in the fact that the greatest variety of logical operations can be realized with a single device constructed in accordance with the invention. This is made possible by the variable operation control. This makes it possible, for example, to selectively operate a device, according to the present invention, as an AND gate, as an OR gate, as a NAND gate, as a NOR gate or as an inverter. Given a change from one logical operation to another, the device completely loses the properties of the one logic operation and assumes the properties of the other logical operation. The change is reversible.

A particularly expedient and advantageous embodiment of the invention provides that the device is characterized in that the status variable or operation control is designed in such a manner that it variably influences the apparatus so that an individual change of the status variable is effected per variable value for each variable and the sum of these effected individual changes corresponds to the overall change of the status variable which is to be measured.

This embodiment is advantageously employed in apparatus in which successive changes of the periodic status variable add up arithmetically so that the overall change is the sum of the individual changes.

This device is advantageously employed in devices whose apparatus is additionally characterized by a spatial spread. A time-shortening parallel mode in the status variable or operation control is possible here as a result of dexterous spatial disposition.

Moreover, a device of the type just mentioned which additionally exhibits the previous characterization that the status variable is designed as a variable operation control which the overall change of the status variable assigned to the individual values or sets of values of the logical variables are individually variable, is additionally advantageously designed such that the individual changes are individually variable in the variably-influencing operation control.

A particularly preferred and advantageous embodiment of the invention further provides that the operation channel with the periodic status variable apparatus has an energy source for generating an energy flow which is characterized by a periodic status variable, and an energy transmission channel leading to the analyzer over which the status variable or operation control influences the energy flow. In this embodiment, the system is additionally characterized by spatial extent.

The last-mentioned device may be further characterized in that the individual changes of the periodic status variable can be influenced by the variably-influencing status or operation control at locations following one another along the transmission channel. It may also be further characterized in that the energy source consists of a light source for generating light as the energy flow which can be supplied over a light transmission channel to an analyzer detecting a periodic status variable of light which can be influenced by an electric field or a magnetic field, and in that the status variable or operation control exhibits one or more variable-controlled, field-generating elements of which each generates a field in the light transmission channel, the variable-controlled strength of the field being dimensioned in such a manner that it effects an overall change or individual change of the status variable. The device may be further characterized in that, given one or more field-generating elements, the generated field is variable independently of the logical variables and, therefore, an operation control exists.

The device may be further characterized in that the light source generates light in a linearly-polarized condition, in that the light transmission channel contains a material which exhibits the Faraday effect, in that the analyzer comprises a polarization analyzer, and in that each field-generating element comprises an electrical coil surrounding the light transmission channel and a variable-controlled current source which supplies a current of such strength that the coil traversed by the current generates a magnetic field aligned in the longitudinal direction of the light transmission channel which is of such strength that it effects a rotation of the plane of polarization of the light by a rotational angle which corresponds to an overall or an individual change of the angle of rotation forming the periodic status variable. This is apparent in FIGS. 3 and 4.

The device may be further characterized in that the light source generates coherent light, in that the light transmission channel contains a material exhibiting the Pockels effect, in that the analyzer comprises a phase discriminator which determines the phase of the coherent light supplied thereto via the transmission channel relative to a comparison phase, and in that each field-generating element comprises a pair of electrodes disposed adjacent the transmission channel and a variable-controlled voltage source which supplies a voltage of such strength that the appertaining electrode pair generates an electric field which is of such strength that it produces a phase shift in the coherent light beamed through the field as a result of the Pockels effect, the phase shift corresponding to an overall or individual change of the phase forming the periodic status variable. This is apparent from FIG. 5.

The latter two discussed devices therefore take advantage of the Faraday effect and the Pockels effect, respectively.

It is particularly the device which takes advantage of the Pockels effect which permits extremely short operation times which can lie in the picosecond range even given more complicated operations.

A device according to the present invention can also be realized with traditional electronic components. Such a device is characterized in that the operation channel, including the periodic status variable apparatus, comprises a cyclical adder modulo k to which binary numbers can be supplied over one or more number inputs and whose computational state corresponds to the periodic status variable, in that the analyzer comprises an evaluation circuit which assigns a logical value to each computational state according to the predetermined evaluation function, and in that the status variable or operation control comprises a binary number generator having one or more binary number outputs which are connected over variable-controlled switch elements to the binary number inputs.

One preferred embodiment of this last-discussed device provides that the counter or adder comprises a binary adder, with a predetermined number k, as a modulo-k adder.

In another preferred embodiment of the last-mentioned device, the evaluation circuit comprises a comparison circuit which compares the respective counter reading or computational state to a number lying between the smallest and largest possible counter reading or computational state. An actual evaluation circuit is provided which assigns a binary value to the counter reading or computational state when the same is smaller than or, respectively, equal to or smaller than the comparison number or assigns the other binary value to the same when it is equal to or greater than or, respectively, greater than the comparison number.

A particular advantage, given these devices constructed in a purely electronic manner, lies in the fact that a multitude of different logical operations can be executed with a single, relatively simply-constructed circuit when the status variable control is designed as an operation control. Therefore, for example, the best-known and most important logic elements, such as the AND gate, the OR gate, the NOR gate, the NAND gate and the inverter can be realized, for example, with a circuit comprising a binary adder, a binary number generator or counting pulse generator and with a relatively simple evaluation circuit. The change from one element to the other merely occurs by means of reversing the operation control, and this can occur by means of control pulses.

A particularly advantageous and expedient embodiment of a device constructed in accordance with the invention in which the overall change of the periodic status variable is effected by individual changes of the variable is characterized in that the status variable or operation control influences this system in such a manner that each effected individual change is a multiple of a predetermined unit change. This device exhibits the particular advantage that the evaluation function "var" can be represented in a particularly simple and surveyable manner. This results in the fact that the corresponding device is also lent a very surveyable and simple structure.

In addition, however, a very special advantage, given such a device, also lies in the completely new perception that logical operations dependent on a plurality of logical variables can be represented in a closed form. This even applies for an unlimited number of variables for three base operations in bivalent logic.

Therefore, the possibility of a closed representation of a multitude of logical operations in an analytical form is made possible for the first time. At the same time, the argument of the evaluation function in this analytical form also describes a technical realization of the logical operation prescribed by the evaluation function. A device for realizing a desired logical operation can be regularly constructed from the truth table characterizing the logical operation and from the analytical evaluation function.

Since the preconditions for this essentially lie in the fact that it is only individual changes which are a whole multiple of a predetermined unit change which can be effected, a corresponding device can be realized everywhere where linear effects, such as the Faraday effect or the Pockels effect, are employed for influencing the apparatus. This precondition can also be met given the electronic realizations.

More complex Boolean expressions frequently contain bracketed expressions. A device for realizing a logical operation corresponding to such an expression is advantageously designed so that the bracketed Boolean expression in the Boolean formula is interpreted as a single variable and the formula formed with this single variable is realized with an assigned device having an operation channel and having status variable or operation control. The bracketed Boolean expression is realized by means of an assign device having operation channel and status variable or operation control. The logical values generated by this device are supplied as signals to an input of the status variable or operation control of the former device, the input being provided for the single variable.

An advantageous embodiment of the invention further provides that the transmission channel is constructed of different materials which are successively disposed in the channel in the propagation direction of the light. The different materials effect maximum status variable changes at different light frequencies. A transmission channel constructed in such a manner with various materials contains a plurality of channels separated, frequency-wise, on which a plurality of logical operations can be executed. Given this embodiment, the logical complexity is reflected in a uniformly one-dimensional complexity of the layer structure of the operation channel compared to the two-dimensional complexity given traditional circuit realizations. As a result, a significant simplification of manufacture can be achieved (identical modules for a great variety of tasks).

Because of the flexibility offered by the present invention, there is a possibility of integrating all functions of an arithmetic logic unit (ALU). A plurality of status variables can be exploited.

A device constructed in accordance with the present invention is preferably operated in that an operation to be carried out is set over the operation control and is carried out with concrete values of the assigned variables. By so doing, a successive processing of logical operations is made possible in that the respective operation to be carried out is set by way of the operation control and is immediately executed with the concrete values of the assigned variables.

When the result of one operation is to be taken into consideration in the next operation, then one advantageously proceeds by providing the result of one operation to an assigned variable input of the same device in the form of a carry and the next operation is executed with that carry.

Thereby, each logical operation is executed in such a manner that, in a control phase, the operation is set in the operation control which is charged with concrete variable values and, in an operating phase, the set operation is carried out by activating the operation channel.

Frequently, the results of a plurality of preceding operations must be taken into consideration in an operation. In such a case, one expediently proceeds by intermediately storing the results of the preceding operations and then providing the stored results to assign variable inputs before the next operation phase.

A particularly advantageous operating mode provides that, for executing a logical operation, successive short-duration energy pulses are transmitted through the energy transmission channel and each status variable or operation control is only activated for generating a status variable change shortly before a pulse reaches the same. With this operating mode, a plurality of logical operations can be successively executed more quickly, particularly when a respective logical operation is assigned to each of the successive pulses.

Given the latter type of operation, one expediently proceeds in such a manner that, by means of a coordinating control having a memory, each separate operation control, each time it has been left by a pulse and before it has been reached by a next pulse, is set to an individual change of the status variable which is required by the logical operation assigned to the next pulse. A plurality of different or complex logical operations can be realized with such a coordinating control, being realized with a single device having a single operation channel and with separate operation controls per variable. The setting of an operation control constructed with separate operation controls to a logic operation then advantageously occurs in that each pulse to which a logical operation is assigned is preceded by an encoded signal which contains the appertaining change for each separate operation control as information to which this control is to be set. Each separate operation control is set by the encoded signals.

An advantageous coordinating control is characterized by a programmable memory in which the logical operations to be successively carried out can be inscribed in the form of row-wise or column-wise disposed in coded signals which respectively correspond to individual changes.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a block diagram illustration of the basic structure of a device constructed in accordance with the present invention for realizing a logical operation;

FIG. 2 is a more detailed showing of the device of FIG. 1 in which the apparatus is characterized by a light transmission channel;

FIG. 3 is a schematic representation of an embodiment of the invention of the type illustrated in FIG. 2 which exhibits an apparatus characterized by light, the apparatus being influenced by the Faraday effect;

FIG. 4 is an embodiment of the invention, according to FIG. 3, which, however, is somewhat modified by the provision of a plurality of influence stages;

FIG. 18 is a tabular illustration showing which preceding, coded signals of the individual clocks are to be applied to the inputs of the variable control at specific times at which three pulses are to be generated in reference to FIG. 17.

DESCRIPTION OF THE PREFERRED EMBODIMENTS

Figure 5:
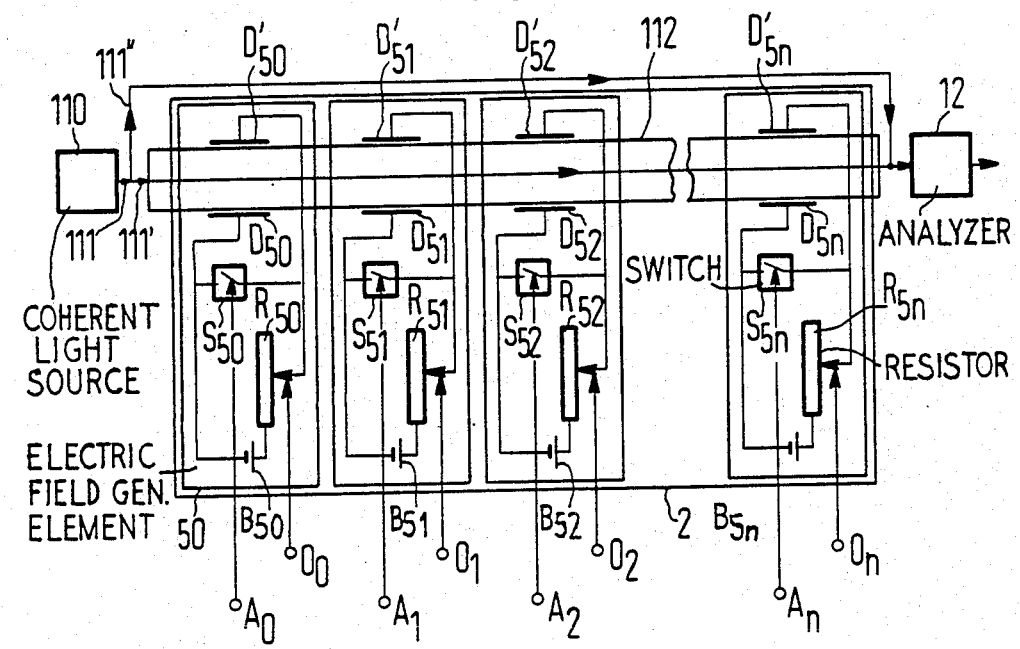
FIG. 5 is a schematic illustration of an embodiment of the invention according to FIG. 2 which likewise exhibits an apparatus characterized by a light, the system, however, being influenced by the Pockels effect.

The general structure of a device for realizing a logical operation according to the present invention is illustrated in FIG. 1 and exhibits an operation channel 1, illustrated by an area bounded with broken lines, and a status variable control 2. The operation channel 1 comprises an apparatus 11 characterized by a periodic status variable $\alpha$ and an analyzer 12 with which the values of the periodic status variable $\alpha$ can be detected and which assigns logical values var($\alpha$) to these values according to a predetermined evaluation function var.

The apparatus 11 can be any conceivable physical system which can be characterized by any kind of externally-variable periodic status variable.

The analyzer must fulfill two tasks. On the one hand, it must measure the status variable and, on the other hand, it must assign every measured value of the status variable the logical value var($\alpha$) assigned thereto according to the predetermined evaluation function var, the logical value var($\alpha$) being available at an output of the analyzer 12 in the form of an electrical signal, for example.

The status variable control 2 controlled by the logical variables $A_1, A_2 \ldots A_n$ and influencing the apparatus 11 effects a respective sign overall change $\Delta\alpha$ of the status variable $\alpha$ per value of the logical variables $A_1, A_2 \ldots A_n$, and the status variable can also assume the value zero. Given a logical operation to be executed with only one logical variable, the value of the single variable takes the place of the set of values.

The status variable control 2 must effect such an overall change $\Delta\alpha$ assigned to a value or a set of values of the logical variables that the logical value assigned to the value of the status variable $\alpha$ changed by this overall change corresponds to that value assigned to the value or set of values of the logical variables in the truth table characterizing the logic operations. How these overall changes can be determined in the specific instance is specified hereinbelow for logical operations of bivalent Boolean logic.

Although the realization of logical operations of higher-level logics is possible with the device just described, the following is limited to bivalent Boolean logic.

In the bivalent Boolean logic, each evaluation function must image the value range of the status variable $\alpha$ onto the range (0, 1) (non-standardized evaluation function war) or, better, to the amount {0, 1} (standardized evaluation function var). In addition to the values 0 and 1, the nonstandardized evaluation function war can assume every value therebetween, whereas the standardized evaluation function var can only assume 0 or 1. An expediently standardized evaluation function which is employed below is given by the equation $$var = (\tfrac{1}{2})[1 + (war(\alpha)/|war(\alpha)|)]$$

in which war($\alpha$) denotes a random, non-standardized evaluation function.

An expedient, non-standardized evaluation function war($\alpha$), which is likewise continuously employed below, is given by the equation $$war(\alpha) = -\cos(2[(\alpha - \alpha_1)/(\alpha_2 - \alpha_1)])$$

in which $\alpha_1$ is the smallest and $\alpha_2$ is the greatest value which the status variable $\alpha$ can assume.

FIGS. 2–5 illustrate embodiments of a device according to FIG. 1 in which the Faraday effect (FIGS. 3 and 4) or the Pockels effect (FIG. 5) is exploited.

First, FIG. 2 illustrates a special operation channel 1 suitable for all examples and also employed in these examples. Given this operation channel, the apparatus 11 comprises a light source 110 which emits a coherent, linearly-polarized light beam 111 which is supplied via a light transmission channel 112 to the analyzer 12 of the operation channel. The light transmission channel 112 must contain a material which exhibits the Faraday effect or the Pockels effect. In the case of the Faraday effect, the light transmission channel can consist of a light conductor comprising glass and must contain material which is magneto-optically active. In the case of the Pockels effect, the light transmission channel 112 must contain material which is electro-optically active.

The Faraday effect is the rotation of the plane of polarization of light or, respectively, of electro-magnetic waves in general, under the influence of an applied magnetic field. A linearly-polarized light beam which propagates through a special material with the thickness l parallel to the field lines of an applied magnetic field with a field strength H is rotated in its plane of polarization about an angle of rotation $\rho$, whereby the expression $$\rho = R \cdot l \cdot H$$

applies, where R is Verdet's constant which depends on the specific material as well as on the frequency of the polarized light and on the temperature. High values of the magnetic rotation can be achieved given magnetizable substances such as, for example, iron, nickel, cobalt, etc. Given a magnetic induction of 10,000 Gauss, 1/50 mm thick iron supplies a rotation of 360°.

Given diamagnetic substances, Verdet's constant is positive, meaning that the plane of rotation is positive, i.e. is rotated counterclockwise around the direction of the magnetic field.

In the Pockels effect, a change of the index of reflection of the material is produced by applying an electric field to a special electro-optical material. Light which passes through this material, therefore, is subject to a phase shift. The shift is proportional to the strength of the applied electric field.

A first embodiment of a device according to FIG. 2 which exploits the Faraday effect is illustrated in FIG. 3. The status variable control 2 of this device comprises a field-generating element 3 which generates an axial magnetic field $H_3$ in the light transmission channel 112. The light transmission channel must contain a material in the area of this field which exhibits the Faraday effect. The magnetic field is generated by an electrical coil $L_3$ surrounding the light transmission channel 112, the coil $L_3$ being connected to a current source generating a current $I_3$.

The current source comprises a source $B_3$ supplying a current, for example, a battery, a plurality of resistors $R_{30}$, $R_{31}$, $R_{32}$, ... $R_{3n}$, as well as variable-driven switch elements $S_{30}$, $S_{31}$, $S_{32}$ and $S_{3n}$.

A terminal of the source $B_3$ is connected to one end of a coil, whereas the other end of the coil is connected to the other terminal of the source $B_3$ via the switch elements and the resistors. The resistors $R_{30}$, $R_{31}$, $R_{32}$, ... $R_{3n}$ are connected in parallel and an appertaining switch element $S_{30}$, $S_{31}$, $S_{32}$ ... $S_{3n}$ is connected in series with each of the resistors. Each of the switch elements $S_{30}$, $S_{31}$, $S_{32}$ ... $S_{3n}$ is controlled by a respectively-assigned logical variable $A_0$, $A_1$, $A_2$ ... $A_n$, being controlled, for example, in such a manner that the logical level "0" of a logical variable opens the appertaining switch element or leaves the same open, whereas the logical value "1" of the appertaining variable closes the switch element and keeps it closed.

The current $I_3$ flowing through the coil $L_3$ is provided by the sum of the individual currents $I_{30}$, $I_{31}$, $I_{32}$ ... $I_{3n}$ flowing through the individual resistors and switch elements connected in series.

Since the strength of the generated magnetic field is proportional to the current measured in current intensity and flowing through the coil, the overall magnetic field $H_3$ generated by the overall current $I_3$ can be interpreted as a sum of individual fields which are individually generated by the individual currents $I_{30}$, $I_{31}$, $I_{32}$ ... $I_{3n}$. Each of these individual currents is zero when the assigned logical variable assumes the value "0" or it assumes the value determined by the assigned resistor when the assigned logical variable assumes the value "1".

As already mentioned, the magnetic field $H_3$ produces a rotation of the plane of polarization in the material about an angle of rotation which is proportional to the measured thickness of the material in the direction of the magnetic field and is proportional to the strength of the magnetic field. For example, assume that the linearly-polarized light 111 emitted by the light source 110 is linearly-polarized in the plane of the drawing. When, for example, the material exhibits a positive Verdet's constant in the area of the magnetic field $H_3$, the magnetic field $H_3$ generates a rotation of the plane of polarization about the direction of the magnetic field $H_3$ counterclockwise about an angle $\rho$ which is proportional to the strength of the magnetic field $H_3$. Accordingly, the plane of polarization in which the light is linearly polarized after passing through the magnetic field described an angle $\rho$ with the plane of the drawing. The angle of rotation $\rho$ which is measured proceeding from a reference plane and in which the light emitted by the light source 112 is initially polarized and may be assumed to coincide with the plane of the drawing, forms the periodic status variable of the apparatus and can assume $0.2\pi$ and all values in between.

Since the magnetic field $H_3$ is the sum of the individual fields generated by the individual currents $I_{30}$, $I_{31}$, $I_{32}$ ... $I_{3n}$ and the change of rotational angle generated in the material of the transmission channel 112 is proportional to the strength of the magnetic field, the overall change $\Delta \rho$ of the angle of rotation produced by the field $H_3$ can be interpreted as the sum of individual changes, where $i=0, 1, 2, \ldots n$, whereby each individual change is generated by one of the individual fields.

The analyzer device 12 is realized, for example, by means of a simple optical polarization filter having a following photocell. When a threshold switch is additionally connected to the photocell, then the standardized evaluation function mentioned above can be realized when the threshold is placed precisely in the center between the minimum signal value supplied by the photocell and the maximum signal value.

A somewhat different embodiment of a device according to FIG. 2, exploiting the Faraday effect, is illustrated in FIG. 4 and performs the same operation as the embodiment illustrated in FIG. 3.

The essential difference, in comparison to the embodiment according to FIG. 3, is that in the embodiment according to FIG. 4, a separate field-generating element 40, 41, 42 ... 4n is provided for each logical variable $A_0, A_1, A_2 \ldots A_n$. Each of the elements comprises its own electrical coil $L_{40}, L_{41}, L_{42} \ldots L_{4n}$ surrounding the light transmission channel 112, which are successively disposed along the transmission channel 112.

Each of the field-generating elements 40, 41, 42 ... 4n comprises a respective resistor R40, R41, R42 ... R4n, a respective switch element S40, S41, S42, ... S4n and a current or voltage source B40, B41, B42 ... B4n. In each of the field generating elements, one end of the coil is conducted over its resistor to one pole of the source and the other end of the coil is connected over the switch element to the other pole of the source.

Each field-generating element 40, 41, 42 ... 4n generates a respective individual current $I_{40}, I_{41}, I_{42} \ldots I_{4n}$, of which each generates a corresponding individual magnetic field $H_{40}, H_{41}, H_{42} \ldots H_{4n}$. In the area of each of these individual magnetic fields, the light transmission channel 112 again comprises a material which exhibits the Faraday effect. Each of the individual magnetic fields $H_{40}, H_{41}, H_{42} \ldots H_{4n}$ generates a respective individual change where $i=0, 1, 2 \ldots n$ and all individual fields together effect an overall change $\Delta \rho$ which, as in the embodiment according to FIG. 3, is equal to the sum of the individual changes.

The analyzer 12 can, for example, be designed just like the example of an analyzer described with respect to FIG. 3.

An embodiment according to FIG. 2 is illustrated in FIG. 5, exploiting the Pockels effect. Given this device, the light transmission channel 112 must contain an electro-optical material whose index of refraction is variable as a result of an electrical field. The light source 110 must be a coherent light source.

As in the embodiment according to FIG. 4 exploiting the Faraday effect, the embodiment according to FIG. 5 exhibits a respective field-generating element 50, 51, 52 ... 5n for each logical variable $A_0, A_1, A_2 \ldots A_n$. Each of the field-generating elements comprises a pair of electrodes $D_{50}, D'_{50}; D_{51}, D'_{51}; D_{52}, D'_{52} \ldots D_{5n}, D'_{5n}$ disposed next to the transmission channel 112 and a voltage source which supplies a voltage $U_{50}, U_{51}, U_{52} \ldots U_{5n}$ of such strength that the appertaining electrode pair generates an electric field $E_{50}, E_{51}, E_{52} \ldots E_{5n}$ which is of such strength that it produces an individual phase shift $\Delta \emptyset_i$, where $i=0, 1, 2 \ldots n$ in the coherent light 111' which is beamed through the field as a result of the Pockels effect. Therefore, electro-optical material must at least be present between the electrodes of each electrode pair.

Each of the voltage sources comprises a separate voltage source $B_{50}, B_{51}, B_{52} \ldots B_{5n}$, a resistor $R_{50}, R_{51}, R_{52} \ldots R_{5n}$, and a variable-driven switch element $S_{50}, S_{51}, S_{52} \ldots S_{5n}$. The two electrodes of each field-generating element are connected to the actual current source, whereby the resistor is connected between one of the two electrodes and one of the poles of the actual source. The switch element is disposed in such a manner that it can bridge the two poles of the actual source.

Each of the switch elements can be designed similar to a switch element according to the embodiments of FIGS. 3 and 4. For example, it can be designed in such a manner that it remains opened given an application of the logical value "1", so that a voltage is applied between the appertaining electrodes, and that, given application of the logical value "0", it closes, so that the circuit is closed via the appertaining resistor and, as a result, no voltage is applied to the appertaining electrodes.

The analyzer 12 comprises a phase discriminator which determines the phase of the coherent light 111' supplied thereto through the transmission channel 112 in terms of a fixed comparison phase. The phase of the light 111 emitted by the light source 110 which has not yet entered into the light transmission channel 112 is advantageously employed as the fixed comparison phase. To this end, a sub-beam 111" is branched off from the light beam 111 and is reintroduced in front of the analyzer 112 to the light beam 111' which has passed through the transmission channel 112. The intensity of the interfering light is a measure of the phase shift effected in the transmission channel 112 and it can be measured, for example, with a photocell. Since, given this embodiment according to FIG. 5, the phase $\emptyset$ is the status variable of the system and this phase, like the angle of rotation in the Faraday embodiments, is periodically or cyclical, the evaluation function mentioned above can also be realized, for example, with a threshold switch.

It is also true, given the embodiment according to FIG. 5, that the overall phase shift $\Delta \emptyset$ is equal to the sum of the individual shifts $\Delta \emptyset_i$, where $i=0, 1, 2 \ldots n$, generated by the individual field-generating elements. Since the Pockels effect, like the Faraday effect, is a linear effect and the electric field strength is proportional to the voltage, it analogously applies that the generated individual change is proportional to the applied voltage. An embodiment according to FIG. 2 exploiting the Pockels effect can also be designed similar to the Faraday embodiment illustrated in FIG. 3, i.e. only a single electrode pair can be provided and the resistors and switch elements are to be interconnected in a corresponding manner.

Before the significance of the reference symbols $0_0$, $0_1 \ldots 0_n$ in FIGS. 3-5, which have not yet been defined, can be explained, it is disclosed, in general, how specific logical operations can be realized with a proposed device. It is thereby presumed that exclusively linear effects are employed, as is the case given the embodiments according to FIGS. 3-5. It is assumed of the periodic status variable of the system without limitation of the universality that its minimum value is 0 and its maximum value is $2\pi$ and, for the sake of simplicity, it is referenced with $\rho$ with reference to the angle of rotation in the Faraday devices. The standardized evaluation function can thereby be written as $$var(\rho) = (\tfrac{1}{2})[1 - (\cos 2\rho / |\cos 2\rho|)].$$

It is expedient to work with a unit change $\Delta \rho_e$ of the status variable, to the effect that each individual change $\Delta \rho_i$ or, respectively, overall change $\Delta \rho$ is a whole multiple of the unit change and is obtained by means of a succession of such unit changes.

Given such propositions, it can be determined that every logical operation $A_1^*, A_2^*, \ldots A_n^*$ to be executed with n logical variables $A_1, A_2 \ldots A_n$ and which can be represented in the closed form $$A_1^*, A_2^* \ldots A_n^* = var\left[\Delta\rho_e\left(a_o + \sum_{i=1}^{n} a_i A_i\right)\right]$$

can be directly realized, whereby the concrete realization can be read directly from the argument. Let this function be referred to as the general evaluation function in which $a_0$ and the coefficients $a_1$, where $i=0, 1 \ldots n$ are whole numbers and the unit change $\Delta\rho_e$ is $\pi/2 \cdot (2n-1)$.

For each concrete logical operation of bivalent Boolean logic to be carried out with two logical variables, a proposed device for its realization can be constructed with this general evaluation function. Given a random number of variables, devices for the realization of a multitude of such operations, particularly three base operations, can be constructed with the assistance of this evaluation function The method of construction will be explained with reference to the example of the logical operation AND or, respectively, NOR, dependent on two logical variables $A_1$ and $A_2$.

The truth table for the AND function is given by the following

| $A_1$ | $A_2$ | $A_1 \wedge A_2$ |
|---|---|---|
| 0 | 0 | 0 |
| 1 | 0 | 0 |
| 0 | 1 | 0 |
| 1 | 1 | 1 |

The table below then follows from the general evaluation function.

$$var(\Delta\rho_e(a_0 + a_1 \cdot 0 + a_2 \cdot 0)) = 0$$

$$var(\Delta\rho_e(a_0 + a_1 \cdot 1 + a_2 \cdot 0)) = 0$$

$$var(\Delta\rho_e(a_0 + a_1 \cdot 0 + a_2 \cdot 1)) = 0$$

$$var(\Delta\rho_e(a_0 + a_1 \cdot 1 + a_2 \cdot 1)) = 1$$

Since, given two variables, the unit change amounts to $\Delta\rho_e = \pi/6$ and the simplified, standardized evaluation function mentioned above denotes that this assumes the value "0" when the status variable is smaller than $\pi/4$, in contrast whereto the value "1" occurs when the status variable is greater than $\pi/4$, it follows from the four above equations that $$a_0 = 0, \; a_1 = a_2 = 1$$

must apply.

The table below applies to the logical NOR operation.

| $A_1$ | $A_2$ | $\overline{A_1 \vee A_2}$ |
|---|---|---|
| 0 | 0 | 1 |
| 1 | 0 | 0 |
| 0 | 1 | 0 |
| 1 | 1 | 0 |

According to the above table, the following relationships must hold true.

$$var(\Delta\rho_e(a_0 + a_1 \cdot 0 + a_2 \cdot 0)) = 1$$

$$var(\Delta\rho_e(a_0 + a_1 \cdot 1 + a_2 \cdot 0)) = 0$$

$$var(\Delta\rho_e(a_0 + a_1 \cdot 0 + a_2 \cdot 1)) = 0$$

$$var(\Delta\rho_e(a_0 + a_1 \cdot 1 + a_2 \cdot 1)) = 0$$

In this system of equations $a_0 = 3$ is advantageously set. Since $5\Delta\rho_e$ is the smallest value for which the evaluation function var disappears at the other side of $3\Delta\rho_e$ and, from the symmetry in the truth table, it accordingly follows that $$a_0 = 3, \; a_1 = a_2 = 2.$$

The results yielded can be combined as follows. The overall change $\Delta\rho$ is composed of a fixed change $\Delta\rho_0$ which can also be 0 and of two individual changes $\Delta\rho_1$ and $\Delta\rho_2$ which are effected or not depending upon whether the value of the assigned logical variables A or, respectively, A is "1" or "0". The fixed change is the $A_1$-multiple of the unit change $\Delta\rho_e$ and the individual change $\Delta\rho_1$ or, respectively, $\Delta\rho_2$ is the $a_1$-multiple or a $a_2$-multiple of the unit change $\Delta\rho_e$. Logical operations of n logical variables is analogous thereto.

This fact can be simply and surveyably illustrated in a symbolic representation and, therefore, can characterize every logical operation. In this symbolic representation, the operation channel is represented by a line which is crossed by separate groups of vertical dashes. Each dash group represents the fixed status variable change $\Delta\rho_o$ or, respectively, represents a respective variable-controlled individual change $\Delta\rho_i$, where $i=1, 2 \ldots n$. A variable-controlled individual change $\Delta\rho_i$ is additionally distinguished from the fixed change $\Delta\rho_o$ in the symbols in that a specific dash of each dash group belonging to an individual change, which can also be an individual dash, is provided with a U-shaped or V-shaped structure. The plurality of strokes in every dash group is identified by the appertaining coefficients $a_1$, where $i=0, 1 \ldots n$. Therefore, the following symbolic representation derives for the aforementioned AND operation or NOR operation:

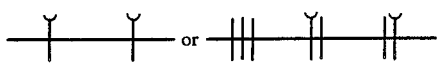

It can be derived therefrom that, in the AND operation, an individual change $\Delta\rho_1=\Delta\rho_e$ and an individual change $\Delta\rho_2=\Delta\rho_e=\pi/6$ are to be carried out, whereas, in the NOR operation, a fixed change $\Delta\rho_o=3\Delta\rho_e$, and an individual change $\Delta\rho_1=2\cdot\Delta\rho_e$ and an individual change $\Delta\rho_2=2\cdot\Delta\rho_e=\pi/6$ are to be carried out. As already mentioned, however, the individual changes are carried out only given one of the two values of the controlling logical variables, but are not carried out at the other value.

The following table provides the appertaining symbol representation and the values of the fixed status variable change and of the individual changes and for all 16 possible logical operations with two variables of the bivalent Boolean logic. The truth tables of these 16 possible operations are also contained in the table. The symbols were calculated with the assistance of the closed form set forth above.

TABLE

| $A_1 * A_2$ | $A_1 A_2$ 1 0 1 1 / 1 0 1 1 | Logical Equation | Symbolic Representation $a_0\ a_1\ a_2$ | $\Delta\rho_0$ | $\Delta\rho_1$ | $\Delta\rho_2$ |
|---|---|---|---|---|---|---|
| 0 | 0 0 0 0 | 0 |  | 0 | 0 | 0 |
| NOR | 0 0 0 1 | $\overline{A_1 \vee A_2}$ |  | $\pi/2$ | $\pi/3$ | $\pi 3$ |
| Inhibit | 0 0 1 0 | $\overline{A_1} \wedge A_2$ |  | 0 | $\pi/6$ | $2\pi/3$ |
| Negate | 0 0 1 1 | $\overline{A_2}$ |  | $\pi/2$ | $\pi/2$ | 0 |
| Inhibit | 0 1 0 0 | $A_1 \wedge \overline{A_2}$ |  | 0 | $2\pi/3$ | $\pi/6$ |
| Negate | 0 1 0 1 | $\overline{A_2}$ |  | $\pi/2$ | 0 | $\pi/2$ |
| Antivalence | 0 1 1 0 | $A_1 \not\equiv A_2$ |  | 0 | $\pi/2$ | $\pi/2$ |
| NAND | 0 1 1 1 | $\overline{A_1 \wedge A_2}$ |  | $\pi/2$ | $\pi/6$ | $\pi/6$ |
| AND | 1 0 0 0 | $A_1 \wedge A_2$ |  | 0 | $\pi/6$ | $\pi/6$ |
| Equivalence | 1 0 0 1 | $A_1 \equiv A_2$ |  | $\pi/2$ | $\pi/2$ | $\pi/2$ |
| Identity | 1 0 1 0 | $A_2$ |  | 0 | 0 | $\pi/2$ |
| Implication | 1 0 1 1 | $A_1 \longrightarrow A_2$ |  | $\pi/2$ | $2\pi/3$ | $\pi/6$ |
| Indentity | 1 1 0 0 | $A_1$ |  | 0 | $\pi/2$ | 0 |

TABLE-continued

| $A_1 * A_2$ | $A_1 A_2$ 1 0 1 1 1 0 1 1 | Logical Equation | Symbolic Representation $a_0\ a_1\ a_2$ | $\Delta\rho_0$ | $\Delta\rho_1$ | $\Delta\rho_2$ |
|---|---|---|---|---|---|---|
| Implication | 1 1 0 1 | $A_2 \longrightarrow A_1$ | | /2 | /6 | 2/3 |
| OR | 1 1 1 0 | $A_1 \wedge A_2$ | | 0 | $\pi/3$ | $\pi/3$ |
| 1 | 1 1 1 1 | 1 | | $\pi/2$ | 0 | 0 |

In order to realize a logical operation characterized by means of a symbolic representation with a device which is characterized in that the status variable or operation control is designed in such a manner that it variably influences the system in such a manner that individual change of the status variable is effected per variable value for each variable and the sum of these effected changes corresponds to the overall change of the status variable which is to be measured, or which is characterized in that the individual changes are individually variable with the variably influencing operation control, or which is characterized in that the operation channel having the apparatus system exhibits an energy source for generating an energy flow with a periodic status variable, and an energy transmission channel leading to the analyzer over which energy transmission channel the status variable or operation control influences the energy flow, one expediently proceeds in such a manner that the logical value "1" is applied to the input $A_0$ and the resistor $R_{30}$, $R_{40}$ or $R_{50}$ is dimensioned in such a manner that the angle of rotation or, respectively, the phase shift generated by the magnetic or electric field amounts to $a_0 \cdot \pi/6$. This corresponds to the fixed change of the angle of rotation or, respectively, phase $\Delta\rho_o$ or, respectively, $\Delta\emptyset_o$. The logic variable $A_1$ is applied to the assigned input and the appertaining resistor $R_{31}$, $R_{41}$ or, respectively, $R_{51}$ is dimensioned in such a manner that the individual change effected by the electric or magnetic field at the value "1" of the logic variable $A_1$ is further equal to $a_1 \cdot \pi/6$. One proceeds analogously for each further existing logical variable up to the last variable $A_n$. The appertaining logic operation has been realized in this manner. It should be pointed out that it is not a matter of the sequence from right to left employed in this symbolic representation for the sake of survey ability. Fundamentally, no sequence need be observed.

According to the above presentation, the logical operation is solely determined by the values of the coefficients $a_0, a_1, \ldots a_n$. For the embodiments according to FIGS. 3–5, this means that the logical operation is solely determined by the values of the resistors therein. If, instead of fixed resistors, one employs controllable resistors which, for example, are controllable over control inputs $0_0, 0_1 \ldots 0_n$, then every logical operation can be realized with a single embodiment of a proposed device The status variable control 2 has then been expanded in this sense to form an operation control.

A device for such an operation control exhibits the completely new property that a logical operation realized therewith can be caused to completely disappear and the realization of a completely different logical operation can be produced. All 16 possible operations can be realized successively and in a random sequence with a relatively simply constructed switching device.

Given the embodiments according to FIGS. 3–5, at least n variable inputs are necessary for the realization of a n-place logical operation, i.e. a logical operation dependent upon n logical variables. When only n variable inputs exist, then only such n-placed operations can be realized in which no fixed status variable change $\Delta\rho_0$ or $\Delta\emptyset_0$ need be effected as is the case for n=2, among other things, for inhibiting or anti-coincidence (see above table).

For the realization of n-place operations having fixed status variable change, the status variable or operation control must be expanded in such a manner that it co-effects this fixed change. Since the fixed change can differ for different operations, it is also expedient, given an operation control, when the fixed change is controllable.

Such an expansion of the status variable or operation control can be realized in various manners, but without difficulties. A particularly expedient and simple realization of such a control comes from a device for realizing a (n+1)-place logical operation, as is given in the embodiments according to FIGS. 3–5, and employs a variable input, the input for the variable $A_0$, for example, in FIGS. 3–5, not as such but, rather, places that input to the logical value which effects a change of status variable. The size of the fixed status variable change can be set over the input for the control signal $0_o$. In addition, the transition from a logical operation having a fixed status variable change to an operation without a fixed status variable change can be controlled by way of the input $A_0$, being controlled in such a manner that a transfer is undertaken from the applied, fixed logical value to the other logical value.

At least for n=2, therefore, all possible n-place logical operations can be selectively realized with a single embodiment of a proposed device with n+1 and +1 inputs for a corresponding plurality of logical variables. Moreover, (n+1)-place logical operations can be realized in which no fixed status variable change is required.

Figure 6:
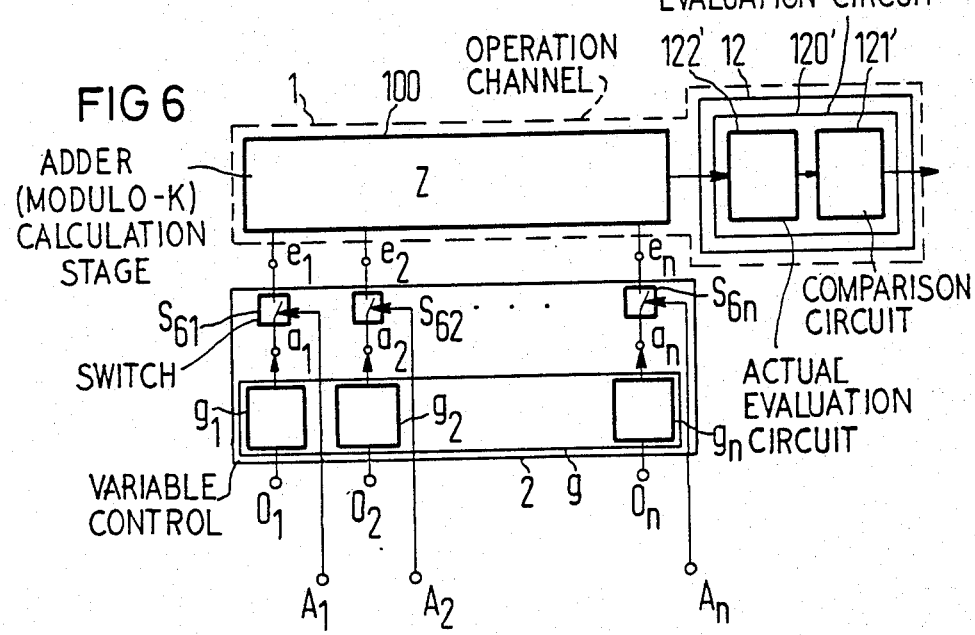
FIG. 6 illustrates a switching algebra realization of a device according to FIG. 1.

An embodiment of a device according to FIG. 1 constructed of binary circuits is illustrated in FIG. 6. Given this device, the operation channel 1, as the apparatus 11, comprises a binary-added modulo-predetermined number k, i.e. a cyclical adder. Binary numbers are supplied to the adder over n binary number inputs $e_1, e_2 \ldots e_n$, the binary numbers being added therein. The respective calculation stage Z in the adder corresponds to the status variable. The period is given by k.

The analyzer 12 comprises an evaluation circuit 120' which assigns a logical value "0" or "1" to each computational state Z according to the predetermined evaluation function var.

The evaluation circuit 120' comprises a comparison circuit 121' which compares the respective computational state Z to a fixed comparison number lying between the smallest and largest possible computational states, and also comprises an actual evaluation circuit 122' which assigns the binary value "0", for example, to the computational state Z when the computational state is smaller than the comparison number and assigns the binary value "1" thereto when it is equal to or greater than the comparison number.

The operation control 2 comprises a binary number generator g having n outputs $a_1, a_2, \ldots a_n$ for binary numbers. These outputs $a_1, a_2, \ldots a_n$ are connected to the binary number inputs $e_1, e_2, \ldots e_n$ of the adder 100 by way of variable-controlled switch elements $S_{61}, S_{62} \ldots S_{6n}$. Each of the switch elements $S_{6i}$ prevents the supply of a binary number from the assigned binary number outputs $a_i$ to the assigned binary number input $e_i$ when the assigned logical variable $a_i$ assumes, for example, the value "0" and enables such a supply given the logical value "1".

Moreover, the binary number generator g is designed in such a manner that, for each of its binary number outputs $a_i$, where $i = 1, 2 \ldots n$, the binary number output serially or parallel therefrom is individually variable over a respective assigned control input $0_i$, where $i = 1, 2 \ldots n$, by which means the operation control is realized.

An exemplary, simple realization of such a binary number generator g exhibits a separate binary number generator $g_i$, where $i = 1, 2 \ldots n$, for each binary number output A where $i = 1, 2 \ldots n$, of which each exhibits one of the respective control inputs $0_i$.

As already mentioned, the period in the embodiment according to FIG. 6 is given by k and the unit change $\Delta Z_e$ of the status variable Z is given by a fixed number which is smaller than k, but by which k can be divided without a remainder.

A fixed status variable change $\Delta Z_o$ can be taken into consideration over an additional binary number input (not illustrated) at the adder 100, by way of which the binary number corresponding to the fixed change $\Delta Z_o$ is input into the adder for addition. This binary number is expediently generated by means of an additional, separate binary number generator which is likewise controllable via a control input, so that the magnitude of the fixed change is variable.

As an example, it is assumed that the realization of the two-place anti-coincidence set forth in the above table be considered with an embodiment according to FIG. 6. For this example $n = 2$ holds true. The unit change is assumed to be provided by the binary number "1". Since, for $n = 2$, the unit change amounts to 1/12 of the overall period length, $k = 12$ applies. For reasons of symmetry, however, half the period length suffices, so that $k = 6$ can be set. A binary counter can then be employed which assumes the binary counter reading 000 after respectively attaining the binary counter reading 101. Since, according to the symbolic representation which can be taken from the above table, no fixed status variable change is to be undertaken for the anti-coincidence, but three unit changes are to be undertaken per variable, the binary number generator g must emit the binary number 011 at the output $a_1$ as well as at the output $a_2$. The processing of these binary numbers can occur in the present case in such a manner that the binary numbers are processed in chronological succession and that each binary number is given as a clock pulse sequence on the counting clock of the binary counter. Upon employing a true adder, a parallel processing of the binary numbers could be undertaken, which would be advantageous, at least when the operation time of the adder is smaller than the operation time of the binary counter.

The comparison circuit 121' can comprise a traditional binary comparator which compares the counter reading to the binary number 100 after the conclusion of the addition. When the counter reading is smaller than 100, the comparator emits the binary value "0", whereas it emits the binary value "1" when the counter reading is equal to or greater than 100. Therefore, the comparison circuit and the actual evaluator circuit are merged in this example.

Embodiments of devices for realizing logical operations having been described in the foregoing, the following passage illustrates how complex logical operations of bivalent Boolean logic, which depend on more than two variables, can be expediently treated and realized. What is meant by complex logical operation in this sense is a logical operation whose logical equation contains a bracketed expression and which, preferably, cannot be further simplified.

For triggering such a logical operation, one proceeds in such a manner that the bracketed Boolean expression in such an equation is interpreted as a single variable and the new equation formed with such a single variable is realized by means of a first proposed device with an operation channel and with a status variable or operation control. The bracketed Boolean expression is realized by means of a second proposed device having an operation channel and a status variable or operation control. The logical values generated by the second device are supplied as signals to an input of the status variable or operation control of the first device, this input being provided for the single variable.

As an example, let the logical operation $(A \lor B) \to B$ be realized. According to the above presentation, $(A \lor B)$ is to be interpreted as a single variable which may be referenced D. The equation formed with this single discrete variable reads $D \to B$, and thus represents a conditional implication operation according to the above table which is realized by the symbol

when $A_1 = D$ is established. The bracketed expression replaced by the single variable corresponds to the logical operation OR which, together with its symbolic representation, can likewise be taken from the above table. This operation is commutative so that it is of no significance whether A or B is taken for $A_1$.

Figure 7:
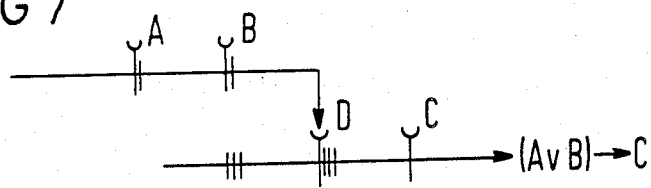
FIG. 7 is a symbolic representation of the logical operation (A∨B)→B in a novel symbolic representation.

In order to realize the above logical equation, the output of the analyzer of the second device which realizes the operation OR is connected to the input provided for the single variable in the first device which realizes the conditional implication operation. The overall result is to be taken from the analyzer of the first device. The symbolic representation of the overall operation is illustrated in FIG. 7.

All expressions or equations provided with brackets can be treated with the method described above, regardless of whether the brackets are necessary or not.

In order to realize complex logical linkages in which a plurality of symbolic representations from the table are linked, one can proceed in such a manner that a separate device having an operation channel and a status variable or operation control is realized for each existing symbol and these are correspondingly connected to one another and operated in chronological succession in a prescribed manner. Given complicated logical formulas, however, this procedure can lead to considerable technical circuit expense.

The successive operating mode, however, permits one to work with only one such device when logical operations are successively processed in that the operation respectively to be executed is set over the operation control and is immediately carried out with concrete values of the assigned variables.

When the result of one operation is to be taken into consideration in a next operation, the same is supplied to the assigned variable input in the form of a carry and the next operation is executed with this carry.

Thereby, each logical operation is advantageously executed in such a manner that, in a control phase, the operation is set in the operation control which is charged with the assigned, concrete variable values and, in an operation phase, the set operations executed by activating the operation channel. Frequently, the results of a plurality of preceding operations must be taken into consideration in an operation, for example, when, given a complex logical operation, two bracketed expressions are next to one another such as, for example, given $(A \rightarrow B) \wedge (B \rightarrow C)$. Here, one expediently proceeds in such a manner that the results of the preceding operations to be taken into consideration are intermediately stored and are applied before the operation phase of the operation to the assigned variable inputs.

Figure 8:
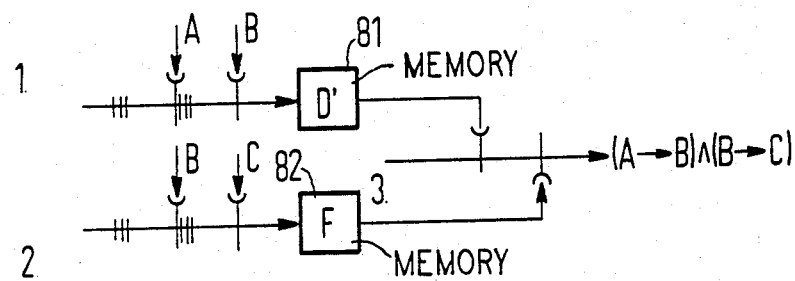
FIG. 8 is a symbolic representation of the logical expression (A→B)∧(B→C) in the new symbolic representation.

This will be briefly explained with the example $(A \rightarrow B) \wedge (B \rightarrow C)$ on the basis of FIG. 8. In a first operation, $A \rightarrow B$ is determined and the result is stored in a memory 81 as the value of a variable D'. In a second operation, $B \rightarrow C$ is determined and the result is likewise stored in a memory 82 as the value of a logical variable F. In a third operation, the stored values of the variable D' and F are applied to the assigned inputs in the control phase and the operation is therefore set up.

Given the devices according to FIG. 2 whose apparatus 11 are characterized by an energy flow, therefore, for example, given Faraday or Pockels devices in which, additionally, single changes of the status variables are generated per variable by a respective separately assigned status variable or operation control as is the case, for instance, given the embodiments according to FIGS. 4 and 5, a logical operation can also be executed in such a manner that successive short duration energy pulses are forwarded through the energy transmission channel 112 and each status variable or operation control is only activated to generate a status variable change shortly before a pulse reaches the same.

Given this operating mode, a plurality of logical operations can be more quickly executed in succession when a respective logical operation is assigned to each of the successive pulses. When the pulse duration is selected so short that a pulse does not reach a separate control until it leaves or has already left the preceding control, then, given n separate controls, n-times more logical operations can be executed in the same time in comparison to the parallel mode in which the n separate controls are driven in parallel per operation and given which the next logical operation cannot be begun until the preceding operation has been terminated. To this end, the spacing between the pulses is simply to be selected so small that successive pulses simultaneously traverse successive separate controls.

When various logical operations are to be carried out in this manner, a coordinating control with a memory must be present which sets each separate operation control, when it has been left by a pulse and before it is reached by the next pulse, to the individual change of the status variable which is required by the logical operation assigned to the next pulse.

Given such a coordinating control, a plurality of different or complex logical operations can likewise be realized with a single device according to FIG. 2 having separate operation controls per variable according to FIG. 4 or according to FIG. 5.

As an example, it is assumed that the three logical operations $\overline{A \vee B}$, $A \wedge B$ and $\overline{B}$ of the bivalent logic are to be realized in this manner for the concrete values $A=1$ and $B=1$ with the device according to FIG. 4 given which $n=2$ holds true. Therefore, $1 \vee 1$ is provided by the symbol

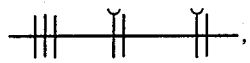

1 1 is symbolically understood to be provided by the symbol

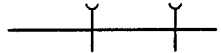

and $\overline{1}$ is provided by the symbol

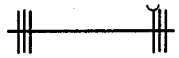

A respective pulse is required for each of these logical operations. For illustrating these operations, three controls will hereinafter be referred to as 20, 21 and 22. Before the first pulse reaches the first separate operation control 20, the control must have been set at a point to according to the first symbol to a fixed status variable change $\Delta \rho_o = 3 \cdot \Delta \rho_e$. After the first pulse has left the first separate control 20 and before the first pulse reaches the second control 21 and the second pulse reaches the first control 20, the latter, preferably at a time $t_1$ must be set according to the first symbol to $2 \cdot \Delta \rho_e$ and the former, according to the second symbol, must be set to 0. Before the first pulse reaches the third control 22, the second reaches the second control 21 and the third reaches the first control 20, the first control 20, at the time $t_2$, must be set according to the third symbol to $3 \cdot \Delta \rho_e$, the second control 21 must be set according to the second symbol to $\Delta \rho_e$ and the third control 22 must be set according to the first symbol to $2 \cdot \Delta \rho_e$. After the first pulse has left the third control 22 in the direction toward the analyzer and, therefore, has essentially carried out the first operation, and before the second pulse reaches the third control 22 and the third reaches the second control 21, the second control 21, at the time $t_3$, must be set according to the third symbol to 0 and the third control 22 must be set according to the second symbol to $2 \cdot \Delta \rho_3$. After the second pulse has left the third control 22 and, therefore, the second logical operation has been essentially carried out, and before the third pulse reaches the third control 22, the third control, at the time $t_4$, must be set according to the third symbol to $3 \cdot \Delta \rho_e$. After the third pulse has left the third control 22, the third logical operation has also been essentially carried out.

The coordinating control can be characterized by the following matrix.

|       | $0_0$         | $0_1$        | $0_2$        |
|-------|---------------|--------------|--------------|
| $t_0$ | $3\Delta\rho_e$ | —          | —            |
| $t_1$ | 0             | $2\Delta\rho_e$ | —         |
| $t_2$ | $3\Delta\rho_e$ | $\Delta\rho_e$ | $2\Delta\rho_e$ |
| $t_3$ | —             | 0            | $\Delta\rho_e$ |
| $t_4$ | —             | —            | $3\Delta\rho_e$ | in which a dash denotes that the appertaining separate control can be set to random values.

Each coordinating control can be characterized by a corresponding matrix. Accordingly, a coordinating control can be realized by a memory in which the appertaining matrix is stored and in that the values stored in the lines of the matrix are applied in parallel to the control inputs $0_i$ of the operation controls at the corresponding clock times $t_j$.

The setting of an operation control, given a device according to FIG. 2, can be controlled, for example, by an energy pulse emitted from the energy source and, in particular, traversing the transmission channel. In such an instance, the coordinating control can be realized, for example, in such a manner that each pulse assigned to a logical operation is preceded by an encoded signal which contains the appertaining change for each separate operation control as information to which the control is to be set. The information contained in an encoded signal precisely corresponds to the information contained in the symbolic representation of a logical operation. At any rate, however, a memory is also required given such a coordinating control, in which memory the logical operations to be successively executed are stored, advantageously in the form of a matrix.

Accordingly, it is expedient when an operation control exhibits a coordinating control which has a programmable memory into which the logical operation is to be successively executed can be respectively inscribed in the form of encoded signals assigned row-wise or column-wise which respectively correspond to individual changes.

A device having such a coordinating control with a programmable memory is extremely flexible because even successive logical operations having mutually different value sets for the variables and even with different variable sets can be executed therewith. By so doing, diverse-place logical operations can also be carried out with a single device.

Given a device according to FIG. 2, a plurality of operations can also be carried out by employing a plurality of channels separated frequency-wise in that the transmission channel is constructed with different materials.

For example, given materials which exhibit the Faraday effect, a frequency dependency of the angle of rotation $\rho$ is contained in Verdet's constant. This frequency dependency is a matter constant and therefore not further variable and, therefore, selectable.

However, there is a light frequency for every material at which the plane of polarization of the light is rotated by a maximum angle of rotation, whereas it is rotated to a lesser degree given frequencies from the environment of this frequency.

Figure 9:
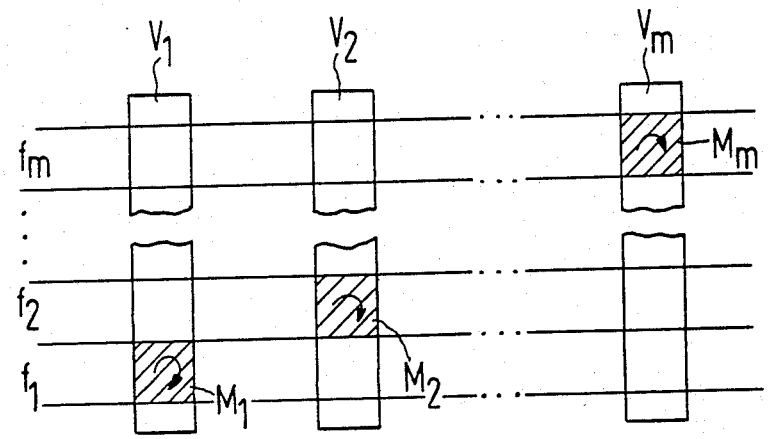
FIG. 9 is a schematic illustration of an operation channel with m operation channels separated frequency-wise which are illustrated spatially separated.

When, accordingly, the transmission channel 112 contains various materials $M_1, M_2 \ldots M_m$, as in FIG. 9, which follow one another in the direction of propagation of the light and when a variable set $V_i = (A^i_0, A^i_1 \ldots A^i_n)$ is assigned to each material $M_i$ which functions at the frequency $f_i$ assigned to the material $M_i$ the angle of rotation is at its maximum, then m such variable sets $V_i$ can be processed and, therefore, a corresponding plurality of logical operations can be carried out if only the frequencies $f_i$ are sufficiently separated from one another. Each operation is then carried out in a separate operation channel characterized by a frequency $f_i$.

The above is schematically illustrated in FIG. 9, whereby the m operation channels, separated frequency-wise, are illustrated spatially separated. In reality, only one physical operation channel is present in which the various materials $M_1, M_2 \ldots M_m$ are successively disposed in the propagation direction of the light and, therefore, are also successively traversed by the light.

A cascade of frequency and polarization filters in the analyzer is connected to the operation channels.

Since the frequency $f_i$ is rotated most in a material $M_i$ but the other frequencies are also co-rotated, the relationship $$\sum_{i=1}^{m-1} \Delta \rho_i \leq \Delta \rho_e / 2$$

must be met in order to avoid indication errors, i.e. the sum of the $m-1$ misrotations of a frequency in channels other than the channel designated by it must be smaller than half the unit change by which the result of each rotation is distanced from the 0–1 boundary.

If one then assumes that all misrotations have the same amount $\Delta \rho_F$, then the relationship $$\Delta \rho_F < \Delta \rho_e / 2(m-1)$$

must apply thereto when m again denotes the number of operation channels.

Given this method, each individual variable, each set of variables or special sets of variables can operate as a memory whose content in the analyzer can be read at the appertaining frequency.

When the crystal structure of a material is controllable, then a channel control can also be provided in addition to the status variable or operation control. Given such a channel control, a mixture of the multi-channel operation just described with a previously-described clock mode can be realized.

Figure 10:
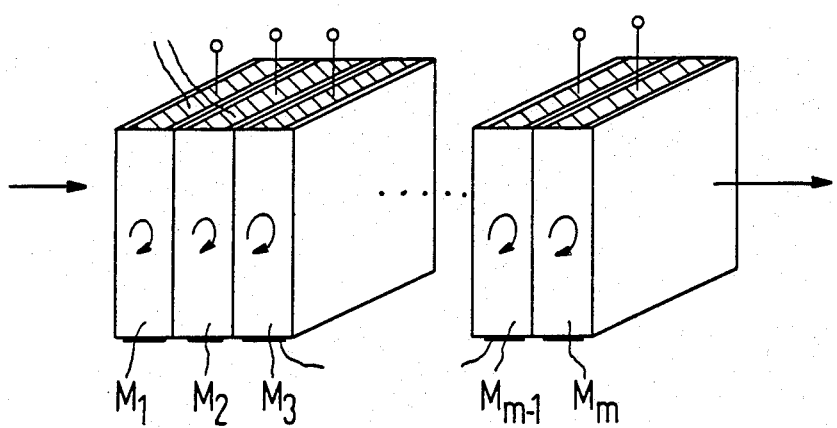
FIG. 10 is a pictorial representation showing the possibility of realizing an operation channel according to FIG. 9.

A possibility for realizing a physical operation channel with operation channels separated frequency-wise is illustrated in FIG. 10. Thereby, and without limiting the universality, it is assumed that this channel is based on the Pockels effect. The channel comprises the layers of various material $M_1, M_2, M_3 \ldots, M_m$ successively disposed in the irradiation direction which exhibit the Pockels effect to various degrees for a corresponding plurality of various frequencies $f_i$. Each layer forms an operation channel separated frequency-wise from the remaining layers, are separate variable set being assigned to the separate operation channel in addition to the appertaining frequency. One or more electrodes provided with terminals for applying voltages are applied to opposite sides of each layer. For the sake of simplicity, each layer is provided with only one electrode pair which is produced by metallic vapor deposition.

In the following, the realization of an adder for binary numbers and its realization in a device for multi-channel operation are described. The adder should enable the addition of two-place binary numbers $u_1 u_0$ and $v_1 v_0$. Since the addition of two two-place binary numbers can lead beyond two places, the result of the addition will generally be a three-place binary number $w_1 w_2 w_0$. Because of the presupposed binary numbers, the binary numbers $u_1 u_0$, $v_1 v_0$, $w_2 w_1 w_0$ can respectively assume only the values "0" or "1".

Figure 11:
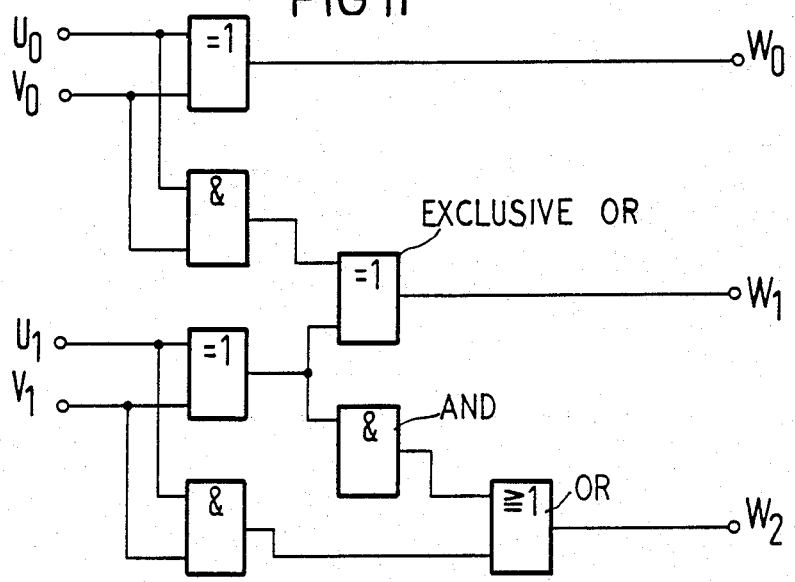
FIG. 11 is a logic circuit diagram illustrating the switching algebra representation of a standard adder for two-place binary numbers having carryover.

A circuit realization of a standard adder of two-place binary numbers with a carry is illustrated in FIG. 11. According to the German Industrial Standard DIN 40 700, part 14, a box with the character =1 signifies an EXCLUSIVE OR element a box with the character & signifies an AND element, and a box with the character $\geq 1$ signifies an OR element in this circuit. An EXCLUSIVE OR element can be realized with two cross-connected inhibitors or with an OR element as is illustrated, for example, in FIG. 12. Thereby, an inhibitor comprises an AND element in which an input identified with a small circle is an input with negation. The EXCLUSIVE OR element can also be interpreted as a half adder or modulo-2 adder without carry.

Figure 13:
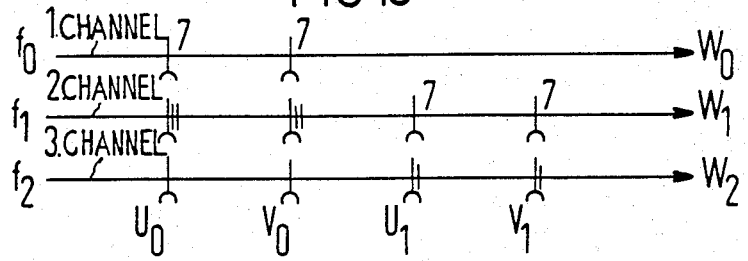
FIG. 13 is a symbolic representation of the logical operation provided by the adder according to FIG. 10.

The symbolic representation of the adder corresponding to the proposed device for multi-channel operation is illustrated in FIG. 13. According to FIG. 13, three operation channels separated from one another frequency-wise are present, of which each supplies one bit of the result. In contrast to the switching circuit case, the operation is carried out in only one clock, i.e. is directly carried out. Since four variables $u_0$, $u_1$, $v_0$ and $v_1$ are present, the unit change amounts to $$\Delta \rho_e = \pi/2(2 \cdot 4 - 1) = \pi/14.$$

The operation is carried out in a first channel with the frequency $f_0$ and the variables $u_0$ and $v_0$, producing the results $w_0$. In a second channel with the frequency $f_1$, the sub-operation with the variables $u_0$, $u_1$, $v_1$, and $v_0$ is carried out, supplying the result $w_1$. Finally, the suboperation which supplies the result $w_2$ is carried out in a third channel with the frequency $f_2$.

The number of strokes in each group of strokes of a channel again indicates the amount of the multiple of the unit change $\Delta \rho_e$ of the individual change assigned to the group of strokes. Each group of strokes of one channel is precisely assigned to one of the four variables, namely, to the variable which is under the group of strokes in FIG. 13. In the present case, a fixed rotation is not to be carried out in any channel. Groups of strokes are contained in FIG. 13 which consist of one stroke with a 7 written adjacent thereto. This symbol is meant to state that such a group contains a total of 7 strokes.

Figure 12:
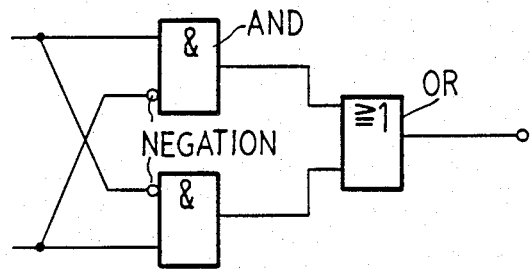
FIG. 12 is a schematic logic diagram illustrating a simple switching algebra realization of an EXCLUSIVE OR gate of the type shown in FIG. 10.
Figure 14:
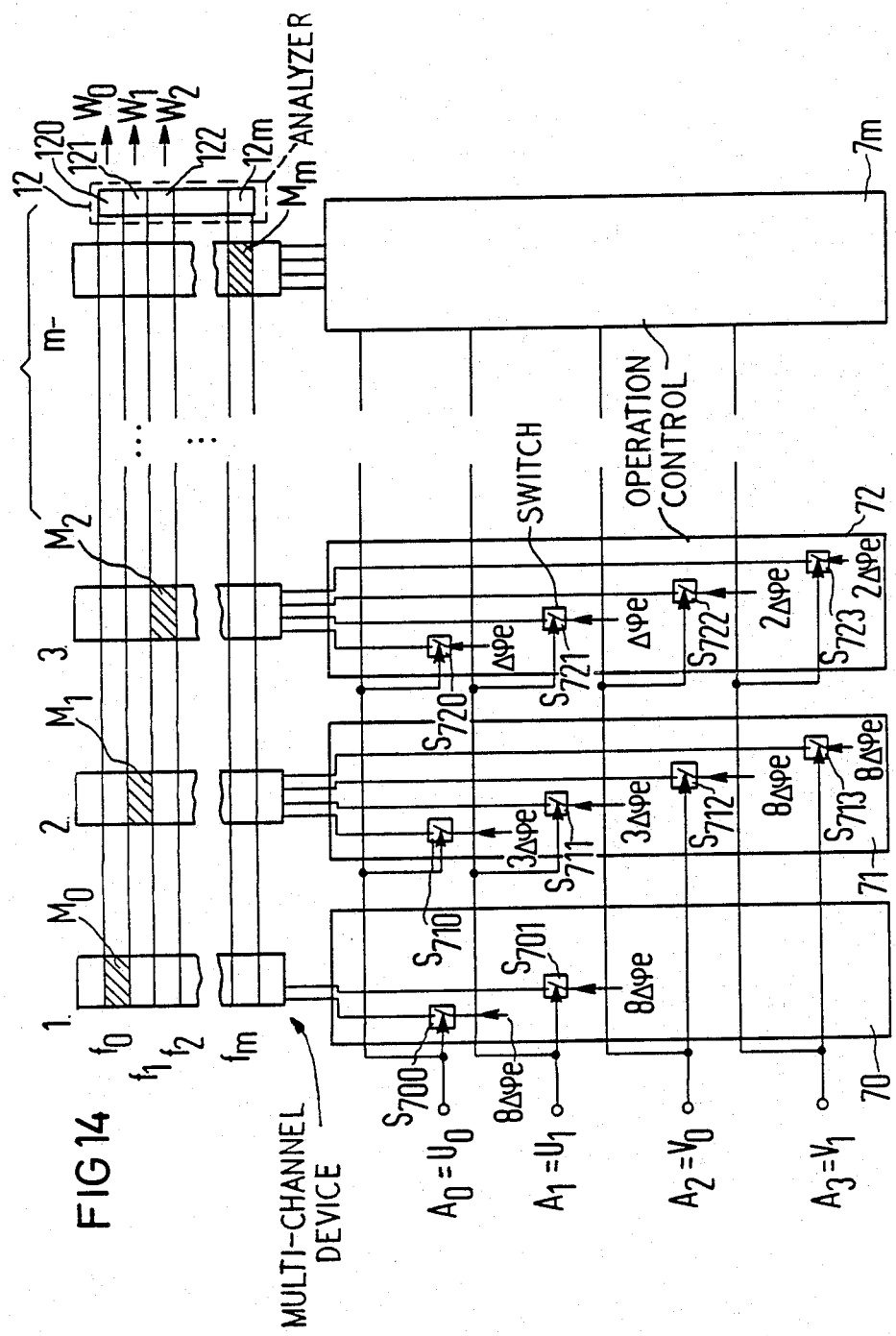
FIG. 14 is a schematic illustration of a device with which the logical operation illustrated in FIG. 13 can be realized.

A multi-channel device according to FIG. 9 for realizing the logical operation illustrated in FIG. 12 is illustrated in greater detail in FIG. 14. The channels, separated frequency-wise, are again illustrated spatially separated. The device exhibits m+1 channels with the respective frequencies $f_0-f_m$. Since three channels are required for the operation according to FIG. 12, m must be equal to or greater than 2. In FIG. 13, m>2 and, therefore, channels are present which are not employed. For each channel with the frequency $f_i$, where $i=0, 1, 2 \ldots m$, the operation channel contains a corresponding material $m_i$. A separate analyzer is also present for each channel, so that the overall analyzer 12 contains m+1 individual analyzers 120, 121, 122 ... 12m.

A separate variable-controlled operation control 70, 71, 72 ... 7m is also present for each channel.

In FIG. 14, the first three channels with the frequencies $f_0$, $f_1$ and $f_2$ are employed, while the other channels are not employed. In the channels which are not employed, the assigned operation controls respectively generate a fixed status variable change independently of the values of the four variables, but such fixed status variable change is preferably selected to be equal to 0.

According to the symbolic representation in FIG. 13, the operation control 70 for the first channel must generate a status variable change of $7 \cdot \Delta \rho_e$ assigned to the variable $u_0$ and must generate a change of the same magnitude for the variable $u_1$. As in FIGS. 3, 4 and 5, the control of the status variable change occurs via variable-controlled switch elements $S_{700}$ and $S_{701}$.

The operation control 71 for the second channel with the frequency $f_1$ must effect a status variable change $3\Delta \rho_e$ for the variable $u_0$ and for the variable $u_1$, as well as a change of $7\Delta \rho_e$ for the variable $v_0$ and for the variable $v_1$. The control of these changes occurs via the switch elements $S_{710}$, $S_{711}$, $S_{712}$, and $S_{713}$.

The operation control 72 for the third channel with the frequency $f_2$ must effect a status variable change of $\Delta \rho_e$ for the variable $u_0$ and for the variable $u_1$, and a change of $2\Delta \rho_e$ for the variable $v_0$ and for the variable $v_1$. The control of these changes occurs by way of the switch elements $S_{720}$, $S_{721}$, $S_{722}$, and $S_{723}$.

The result of the addition is taken from the analyzers 120, 121 and 122, of which the analyzer 120 provides the least-significant bit $w_0$, the analyzer 121 supplies the next most significant bit $w_1$ and the analyzer 122 supplies the most significant bit $w_2$ of the result.

The device of FIG. 14 is operated in parallel, i.e. two binary numbers $u_0$, $u_1$ and $v_0$, $v_1$ to be added are input in parallel and simultaneously over the assigned inputs and the result $w_2$, $w_1$, $w_0$ is output in parallel. The processing of the two numbers in the three channels occurs in parallel in the sense that all individual changes, i.e. all individual changes of all channels, are simultaneously effected. A chronological succession is then only provided in that the light or the equivalent energy flow traverses the individual channels in chronological succession. However, this time delay is negibibly small because the magnitude of the speed of light.

Each of the analyzers 120, 121, 122 ... 12m advantageously comprises a polarizer which is transmissive for the frequency of the assigned channel but is non-transmissive for the frequencies of the remaining channels. This can be accomplished by a correspondingly narrow-band selective filter which, for example, can precede the corresponding polarizer. For example, a filter which is transmissive for the frequency $f_m$, but is non-transmissive for the remaining frequencies $f_0, f_1 \ldots f_{m-1}$ precedes the polarizer of the individual analyzer 12m. The polarizer of this single device is set, for example, in such a manner that it transmissive for light whose plane of rotation has been rotated at an angle between $\pi/4$ and $3\pi/4$ relative to 0 so that a following opto-electronic transducer with a threshold switch can display the logical value "1". The same is analogous for the remaining individual analyzers.

The advantage of the device according to FIG. 14, in comparison to the switching structure according to FIG. 6 or a structure which operates in multi-clock operation, lies in the fact that the single-clock operation requires fewer channels than multi-clock versions, that it makes due without added hardware expense, that it makes due with lower expense altogether, and that concrete calculations can be carried out far more simply.

On the other hand, the version according to FIG. 14 requires a selectivity of the analyzer structure which is higher by the factor $$\nu = [(2\cdot 4) - 1]/[(2\cdot 2) - 1] \approx 2.3.$$

Given two variables, a tolerance zone of $\pi/6$ is allowed at both sides of the 0-1 boundary lying at $\pi/4$. Given four variables, this zone only amounts to $\pi/14$. In general, $\nu$ increases with the number of variables, namely by approximately n/2 when n is the number of variables.

With a corresponding sensitivity in the analyzer, however, a large number of compound operations of n variables can be realized in only one clock, leaving the setting of the operation control out of consideration. Likewise, the operation control must be controllable in finer and finer steps with an increasing number of variables. When the number of variables amounts to n, then the operation control must be able to set approximately $2\cdot(2n-1)$ different values. As a result, a maximum of possible variables on a channel is fixed.

According to the general evaluation function, every two-place logical operation and, therefore, every complex operation in a single operation channel as well, can be carried out in a single clock which, in addition to the operating phase, can contain a control phase for setting the operation. On the other hand, each more than two-place logical operation of two-place Boolean logic can be correctly bracketed in some manner and, therefore, be shaped to a complex logical expression. A specific instance, for example, would be the expression $$(\ldots((A_0 * A_1) * A_2) * \ldots) * A_m$$

in which * represents a random operation of the 16 possible two-place logical operations, and whereby an * and another * in the expression need not indicate identical logical operations.

In terms of switching structure, the expression characterizes a cascade and is itself characterized in that each bracketed expression contains a two-place logical operation between a single variable and a bracketed expression or a single variable.

Such a complex expression can be processed with a single operation channel in the multi-clock mode described above, whereby one bracketed expression is processed in each clock and the result is employed for processing the next most comprehensive bracketed expression in a next clock. The specified cascade can accordingly be executed in $n-1$ successive clocks with a device according to FIG. 1 for the execution of two-place logical operations.

Therefore, logical operations can either be carried out in a very short time in one clock given greater hardware expense or, with a reduced hardware expense, can be carried out in a plurality of clocks given an increased time expense. Since work can be carried out in parallel within a clock, very short clock lengths can be achieved.

Figure 15:
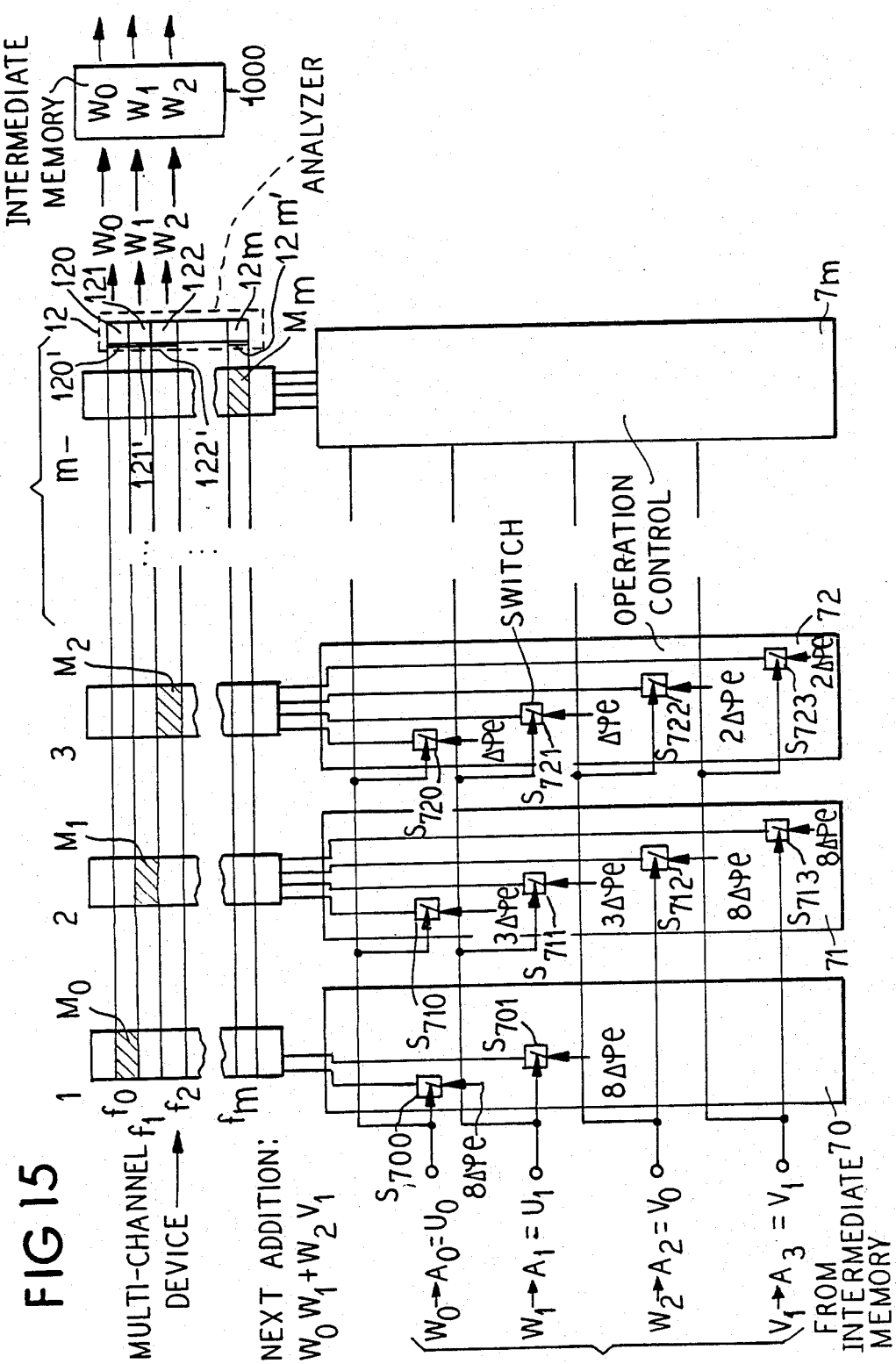
FIG. 15 is a schematic illustration of the device similar to that of FIG. 14 for performing a logical operation, storing the results and utilizing the results as control signals for further operations.

Referring to FIG. 15, each analyzer 120, 121, 122, ... 12m to which the individual frequencies $f_0, f_1, f_2 \ldots f_m$ are assigned has a respective narrow-band polarization filter 120', 121', 122' ... 12n' assigned thereto. The result of the addition $U_0, U_1 + V_0, V_1 W_0, W_1, W_2$ is intermediately stored in an intermediate memory 1000 and is employed for a next addition, for example the addition $W_0, W_1 + W_2, V_1$ in which, accordingly, $A_0 = W_0$, $A_1 = W_1, A_2 = V_0$ and $A_3 = V_1$ are selected.

Figure 16:
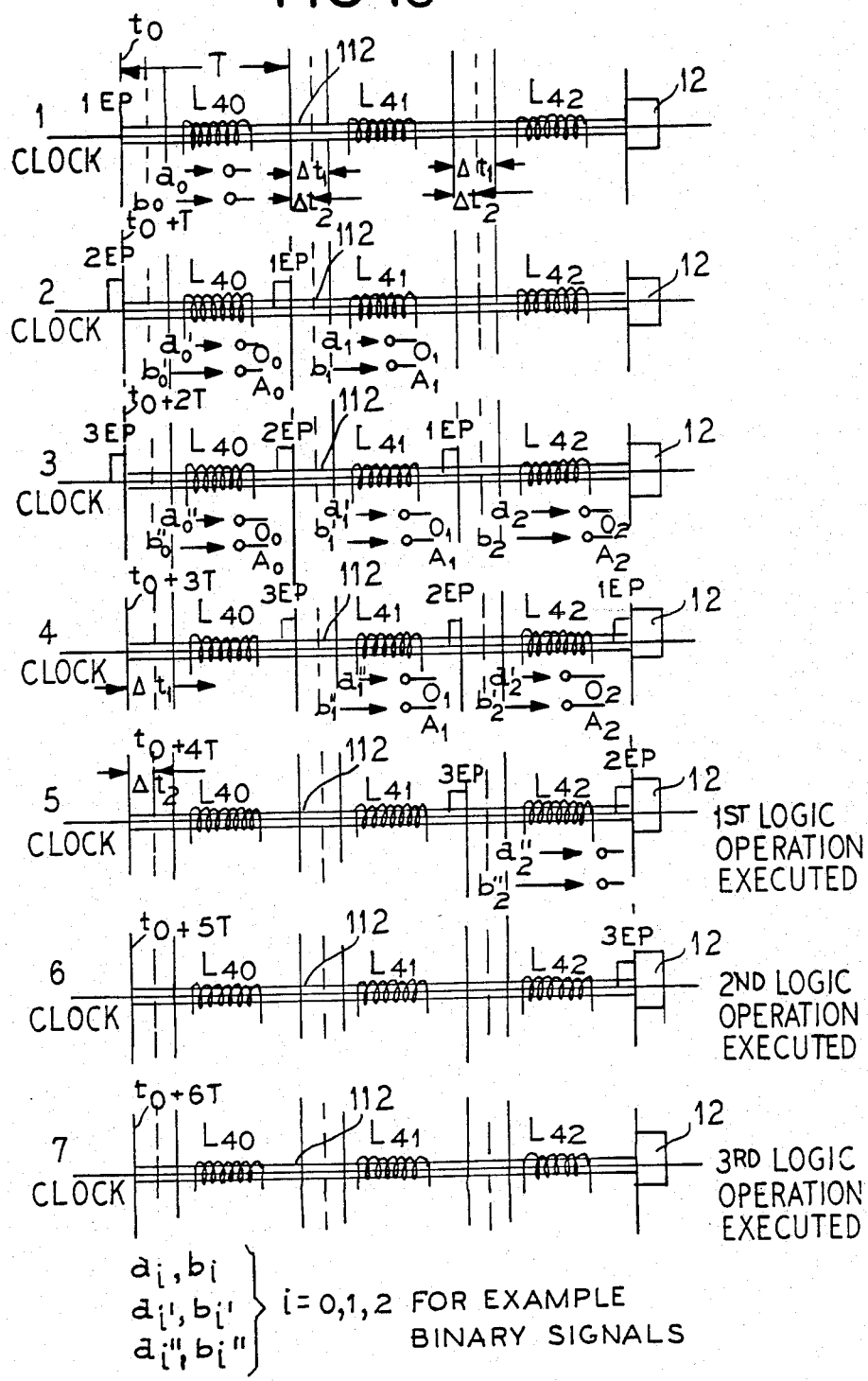
FIG. 16 is a schematic representation of a device constructed in accordance with the present invention and constitutes a timing chart showing first, second and third logic operations.
Figure 17:
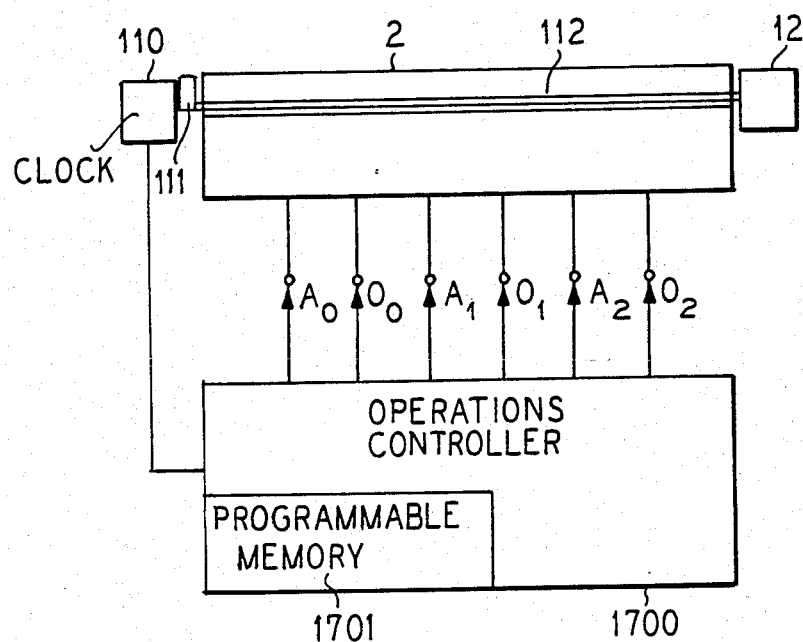
FIG. 17 is a schematic representation similar to that of FIG. 1 illustrating an operations controller with a programmable memory.

FIGS. 16–18 illustrate features relating to FIG. 4, it being assumed that the variable control 2 comprises the separate status variable controls 40, 41, 42 comprising the coils $L_{40}, L_{41}$, or, respectively, $L_{42}$ and the inputs $A_0, 0_0; A_1, 0_1$ or, respectively, $A_2, 0_2$.

It is also assumed in FIGS. 16–18 that only three logical operations are executed, for which three short-duration pulses are transmitted through the energy channel 112. Given the execution of the three operations, a clock having the clock length T is employed in which the three energy pulses are also successively generated, these being referenced 1.EP, 2.EP and 3.EP. A logical operation is assigned to each of the pulses.

By way of a coordinating operations controller 1700 (FIG. 17) having a programmable memory 1701 in which logical operations to be successively executed are respectively storable in the form of coded signals disposed line-wise or column-wise which correspond to respective individual changes, every separate status variable control 40, 41, 42 is set to an individual energy change of the status variable whenever it has been left by an energy pulse and before it is reached by the next energy pulse, this individual change of the status variable being required by the logical operation assigned to the next pulse. Each individual energy pulse 1.EP, 2.EP or 3.EP to which a logical operation is assigned is preceded by a coded signal which contains the appertaining change for each separate status variable control 40, 41, 42 as information to which this control is now to be set and each of these controls is set by the coded signals.

The first logical operation assigned to the first pulse 1.EP is executed with $0_0 = a_0, 0_1 = a_1, 0_2 = a_2$ and $A_0 = b_0, A_1 = b_1, A_2 = b_2$. The second logical operation assigned to the second pulse 2.EP is executed with $0_0 = a_0', 0_1 = a_1', 0_2 = a_2'$, and $A_0 = b_0, A_1 = b_1, A_2 = b_2'$. The third logical operation assigned to the third pulse 2.EP, finally, is executed with $0_0 = a_0'', 0_1 = a_1'', 0_2 = a_2''$, and $a_0 = b_0'', a_1 = b_1'', a_2 = b_2'' (a_i, b_i; a_i', b_i', a_i'', b_i'', i = 0, 1, 2$ can, for example, be binary signals or bits).

The execution of the three logical operations are illustrated in FIG. 16 which shows, in seven momentary clocks, how the three energy pulses 1.EP, 2.EP and 3.EP traverse the operation channel 112 on which the status variable controls 40, 41 and 42 are only represented by the assigned coils $L_{40}, L_{41}$ and $L_{42}$.

At the time $t_0$, the first energy pulse 1.EP appears at the beginning of the channel 112. Chronologically preceding this are the signals $a_0$ and $b_0$. The signal $a_0$ is fed to the input $0_0$ at the time $t_0 - \Delta t_1$ and $b_0$ is fed to the input $A_0$ somewhat later at a time $t_0-\Delta t_2$. A first suboperation at the energy pulse 1.EP traversing the coil $L_{40}$ is executed with these values $a_0$ and $b_0$ which represent preceding, coded signals. At the next clock, i.e. at the time $t_0+T$, the second energy pulse 2.EP is applied to the channel 112 and the first energy pulse 1.EP has departed the coils $L_{40}$ and not yet reached the coil $L_{41}$. It is preceded by the coded signals $a_1$ at the time $t_0+T-\Delta t_1$ and $b_1$ at the time $t_0+T-\Delta t_2$ which are fed to the inputs $0_1$ or, respectively, $A_1$ of the coil $L_{41}$. The second pulse 2.EP is preceded by the coded signals $a_0'$ at the time $t_0+T-\Delta t_2$ and $b_0'$ at the time $t_0+T-\Delta t_1$ which are fed to the inputs $0_0$ and $A_0$ of the coil $L_{40}$.

This pattern is logically continued in FIG. 16. The first logical operation is executed when the first energy pulse 1.EP has left the analyzer 12 at the fifth clock. Correspondingly, the second logical operation is executed at the sixth clock and the third logical operation is executed at the seventh clock.

In the tabular overview of FIG. 18, coded signals within the individual clocks are to be applied to the inputs of the status variable control 2 at which times the three pulses are to be generated. The programmable memory 1701 of the operations controller 1700 is be programmed in accordance with this overview.

It should again be pointed out, in conclusion, that every physical apparatus which can be characterized by a periodic or cyclic status variable is to be understood as an apparatus under consideration according to the invention. The periodic status variable can be a natural physical magnitude such as, for example, the angle of rotation of a plane of polarization of linearly-polarized light relative to a reference plane or the phase of a light wave. However, it can also be a physical magnitude which has been rendered artificially periodic or can even be an artificially-created periodic status variable characterizing a corresponding apparatus such as, for example, the counter reading of a cyclical counter or adder.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A logical operation system, comprising:
    an operation channel means having a status variable associated therewith whose value can be selectively changed by variable control signals input to the operation channel means, said operation channel means having an output at which the selectively changed status variable is present;
    analyzer means connected to said output of the operation channel means for providing logical values at its output according to an evaluation function applied to the selectively changed status variable output from the operation channel means; and
    variable control means connected to said operation channel means for providing said variable control signals thereto, said variable control means having logical variable signals input thereto and operation control signals input thereto, said variable control means employing the logical variable signals and the operation control signals for varying the variable control signals such that the logical variable signals cause changes of the status variable and a magnitude of said changes is varied by the operation control signals, and said variable control means determining a selective change from one logical operation to a completely different logical operation based on values of the operation control signals.

2. A system according to claim 1 wherein the operation channel means comprises an energy transmission channel means for supporting a flow of energy, said status variable being associated with the energy flow; said variable control signals from said variable control means changing the flow of energy, and said analyzer means detecting the changed energy flow at the output of the operation channel means; and an energy source means for providing and directing energy into said energy channel means.

3. A system according to claim 2 wherein said energy source means comprises a light source, said status variable comprises light energy, and said variable control signals from said variable control means control a field generating means at the energy transmission channel means for changing the light energy travelling through the energy transmission channel means.

4. A system according to claim 3 wherein said field generating means comprises a Faraday effect element means for changing a magnetic field which changes the light energy travelling in the energy channel means.

5. A system according to claim 3 wherein said field generating means comprises an electric field generating means for changing the light energy by Pockels effect in the energy channel means.

6. A system according to claim 1 wherein said operation channel means comprises a mathematical calculation unit.

7. A system according to claim 6 wherein said mathematical calculation unit comprises a modulo-k adder.

8. A system according to claim 1 wherein said variable control means comprises a plurality of switch means each controlled by said logical signals so as to produce said control signals output to the operation channel means, and wherein said operation control signals are connected to operation control means for varying the control signals produced by the switch means in response to said operation control signals.

9. A system according to claim 8 wherein said variable control signals comprise a voltage fed through and switched by the switch means, an amplitude of the voltage being determined by said means for varying.

10. A system according to claim 1 wherein said operation channel means comprises a mathematical calculation unit with binary number inputs, and said variable control means comprises binary number generator means for producing said variable control signals as binary numbers at various outputs, said binary number generator means comprising a plurality of switch means controlled by said logical variable signals to connect through the binary numbers, and a plurality of binary number generators controlled by said operation control signals, said variable control signals being varied by a change of numbers being output by the binary number generators.

11. A method of performing a logical function with variable control signals representing logical variables which control a status variable, comprising steps of:

transmitting linearly-polarized light as said status variable through a transmission channel which exhibits a Faraday effect;

applying the variable control signals representing logical variables to at least one device to generate at least one magnetic field longitudinally of the transmission channel to produce a corresponding rotation of a plane of polarization of the light;

analyzing the plane of rotation with respect to a reference point to obtain an angle of rotation; and forming the variable control signals representing the logic variables by use of logical variable signals and operation control signals, the logical variable signals determining changes of the variable control signals, and the operation control signals determining a magnitude of the changes of the variable control signals.

12. A system for performing logical function with variable control signals representing logical variables which control a status variable, comprising:

a transmission channel which exhibits a Faraday effect;

means for transmitting linearly-polarized light through the transmission channel;

means for generating at least one magnetic field longitudinally of the transmission channel when said variable control signals are applied thereto for producing a corresponding rotation of the plane of polarization of the light;

means for analyzing the plane of rotation with respect to a reference plane to obtain an angle of rotation; and means for creating said variable control signals from logical variable signals and operation control signals input thereto, and such that changes of the variable control signals are determined by the logical variable signals and a magnitude of the changes of the variable control signals is determined by the operation control signals.

13. A logical operations system, comprising:

an operation channel means having a status variable associated therewith whose value can be selectively changed by variable control signals input to the operation channel means, said operation channel means having an output at which the selectively changed status variable is present;

analyzer means connected to said output of the operation channel means for providing logical values at its output according to an evaluation function applied to the selectively changed status variable output from the operation channel means; and variable control means connected to said operation channel means for providing said variable control signals thereto, said variable control means having logical variable signals input thereto and operation control signals input thereto, said variable control means varying the variable control signals such that the logical variable signals cause changes of the status variable and a magnitude of the changes is varied by the operation control signals.

* * * * *